United States Patent
Kuisma

(10) Patent No.: US 10,910,549 B2
(45) Date of Patent: *Feb. 2, 2021

(54) PIEZOELECTRIC ROTATIONAL MEMS RESONATOR

(71) Applicant: MURATA MANUFACTURING CO., LTD., Nagaokakyo (JP)

(72) Inventor: Heikki Kuisma, Helsinki (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 229 days.

This patent is subject to a terminal disclaimer.

(21) Appl. No.: 15/988,607

(22) Filed: May 24, 2018

(65) Prior Publication Data

US 2018/0342667 A1    Nov. 29, 2018

(30) Foreign Application Priority Data

May 24, 2017    (FI) .................................... 20175467

(51) Int. Cl.
  H01L 41/113    (2006.01)
  G01C 19/5642    (2012.01)
  (Continued)

(52) U.S. Cl.
  CPC ...... H01L 41/1136 (2013.01); G01C 19/5642 (2013.01); G01C 19/5712 (2013.01); G01C 19/5747 (2013.01); G01P 15/125 (2013.01); H01L 41/094 (2013.01); G01P 2015/0862 (2013.01); H03H 9/02338 (2013.01); H03H 9/2405 (2013.01)

(58) Field of Classification Search
  CPC .......... H01L 41/1136; G01C 519/5762; G01C 19/5642
  USPC ...................................................... 73/504.15
  See application file for complete search history.

(56) References Cited

U.S. PATENT DOCUMENTS 5,166,571 A    11/1992    Konno et al.
6,561,028 B1    5/2003    Aigner et al.
(Continued)

FOREIGN PATENT DOCUMENTS

EP    1 688 705 A2    8/2006
EP    2 899 503 A1    7/2015
(Continued)

OTHER PUBLICATIONS

European Search Report application No. EP 18 17 3725 dated Sep. 20, 2018.
(Continued)

*Primary Examiner* — John Fitzgerald
*Assistant Examiner* — Rodney T Frank
(74) *Attorney, Agent, or Firm* — Squire Patton Boggs (US) LLP

(57) ABSTRACT

This disclosure reveals a resonator where at least one suspended inertial mass is driven into rotational oscillation by a piezoelectric drive transducer, or where the rotational motion of at least one suspended inertial mass is sensed by a piezoelectric sense transducer. The disclosure is based on the idea of suspending the inertial mass with a one-sided suspender arrangement, where only one suspender is attached to each anchor point, and on the optimal positioning of the suspender in relation to the effective center of gravity of the resonator. The resonator may be employed in a resonator system, a clock oscillator or a gyroscope.

15 Claims, 13 Drawing Sheets

(51) Int. Cl.
- *H01L 41/09* (2006.01)
- *G01C 19/5712* (2012.01)
- *G01C 19/5747* (2012.01)
- *G01P 15/125* (2006.01)
- *G01P 15/08* (2006.01)
- *H03H 9/02* (2006.01)
- *H03H 9/24* (2006.01)

(56) References Cited

U.S. PATENT DOCUMENTS

| | | |
|---|---|---|
| 2004/0250620 A1 | 12/2004 | Nicu et al. |
| 2006/0156814 A1 | 7/2006 | Blomqvist |
| 2006/0169041 A1 | 8/2006 | Madni et al. |
| 2009/0320594 A1 | 12/2009 | Ohuchi et al. |
| 2010/0077858 A1 | 4/2010 | Kawakubo et al. |
| 2010/0083756 A1 | 4/2010 | Merz et al. |
| 2010/0242604 A1 | 9/2010 | Sammoura et al. |
| 2010/0309536 A1 | 12/2010 | Akanuma et al. |
| 2010/0313657 A1 | 12/2010 | Trusov et al. |
| 2011/0132087 A1 | 6/2011 | Ohms et al. |
| 2011/0265564 A1 | 11/2011 | Acar et al. |
| 2013/0019682 A1 | 1/2013 | Hsu |
| 2013/0091948 A1 | 4/2013 | Yamamoto |
| 2013/0283909 A1 | 10/2013 | Furuhata |
| 2014/0266170 A1 | 9/2014 | Seeger et al. |
| 2014/0283602 A1 | 9/2014 | Yamamoto |
| 2015/0068308 A1 | 3/2015 | Blomqvist et al. |
| 2015/0316377 A1 | 11/2015 | Gerson et al. |
| 2016/0211778 A1 | 7/2016 | Okada et al. |

FOREIGN PATENT DOCUMENTS

| | | |
|---|---|---|
| EP | 3 034 997 A1 | 6/2016 |
| JP | 2002-267451 A | 9/2002 |
| JP | 2010-256332 A | 11/2010 |
| JP | 2011158319 A | 8/2011 |
| JP | 2012-149961 A | 8/2012 |
| JP | 2016-001157 A | 1/2016 |
| WO | 2006/039560 A2 | 4/2006 |
| WO | 2011/136972 A1 | 11/2011 |
| WO | 2016/097117 A1 | 6/2016 |

OTHER PUBLICATIONS

European Search Report application No. EP 18 17 3731 dated Sep. 19, 2018.
Sep. 25, 2018 Search Report issued in European Patent Application No. 18173764.
Sep. 26, 2018 Search Report issued in European Patent Application No. 18173736.
Finnish Search Report corresponding to Appln. No. 20175467, dated Dec. 21, 2017.
Jing-Quan Liu et al., "A MEMS-based piezoelectric power generator array for vibration energy harvesting", Microelectronics Journal, Elsevier Ltd., Feb. 20, 2008, vol. 39, No. 5, pp. 802-806.
Pradeep Pai et al., "Magnetically Coupled Resonators for Rate Integrating Gyroscopes", 2014 IEEE Sensors, Nov. 2, 2014, 4 pages.
Finnish Search Report corresponding to Appln. No. 20175892, dated Apr. 18, 2018.
Finnish Search Report corresponding to Appln. No. 20175469, dated Dec. 21, 2017.
I. Roland et al., GaAs-based tuning fork microresonators: A first step towards a GaAs-based coriolis 3-axis Micro-Vibrating Rate Gyro (GaAs 3-axis pCVG), Sensors and Actuators A: Physical, Jul. 19, 2011, vol. 172, No. 1, pp. 204-211.
Finnish Search Report corresponding to Appln. No. 20175850, dated Apr. 18, 2018.

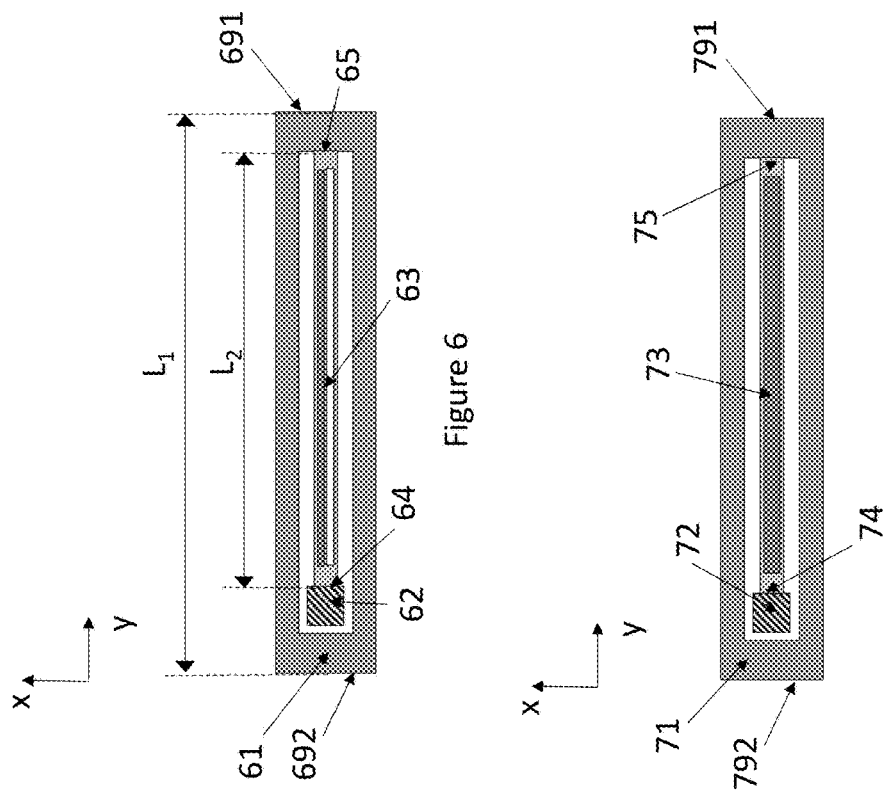
Figure 6
Figure 7
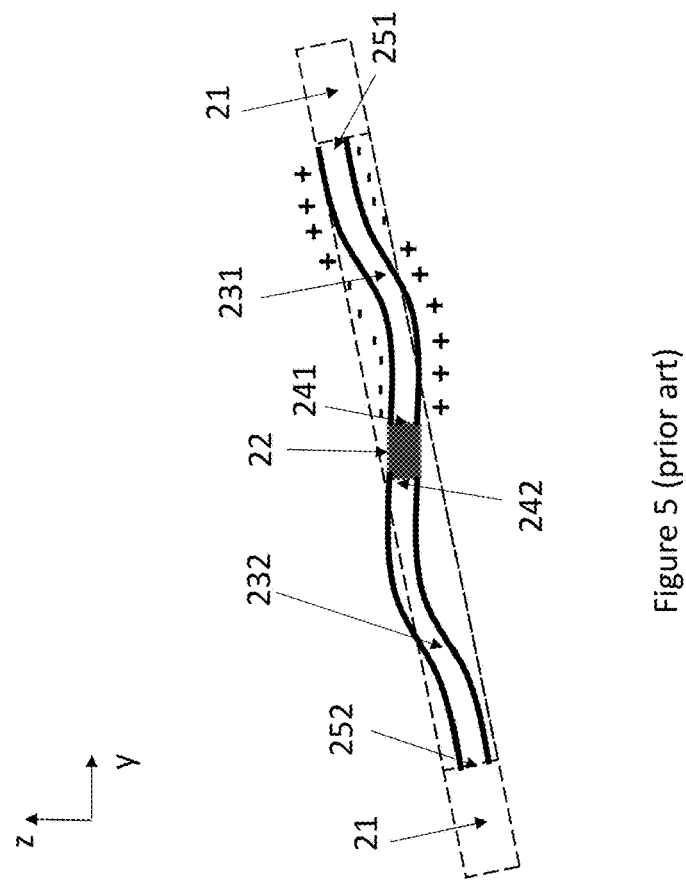
Figure 5 (prior art)

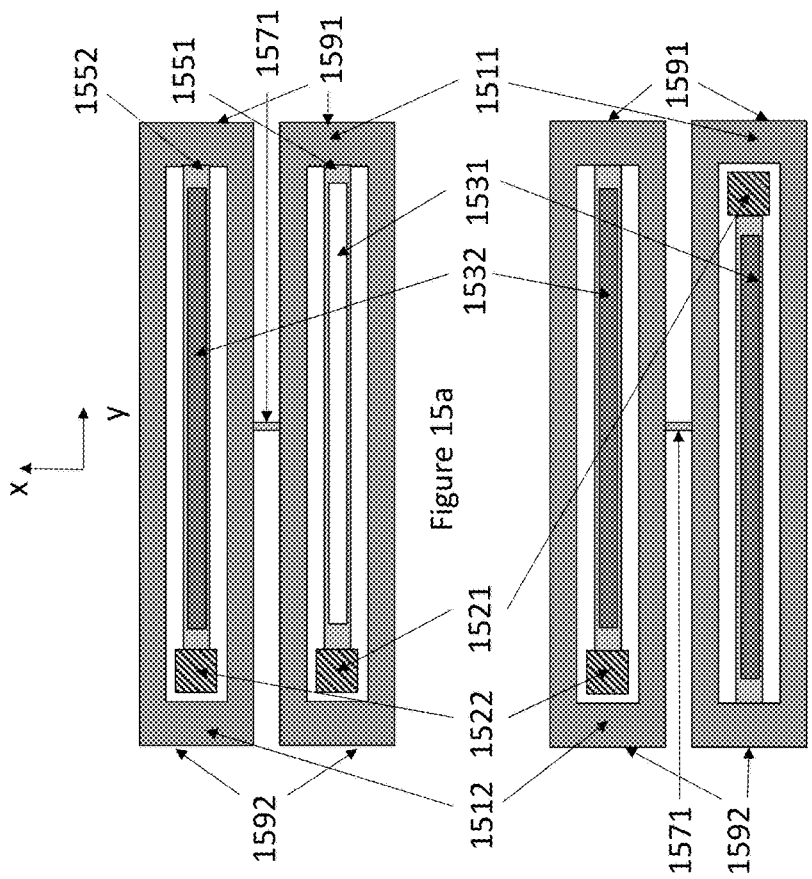
Figure 15a
Figure 15b
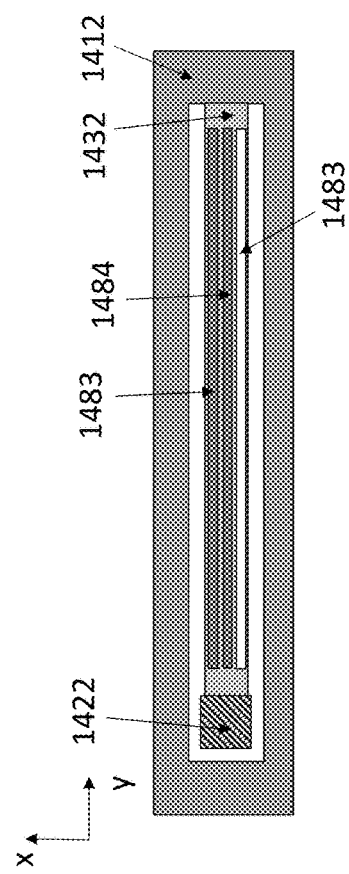
Figure 14a
Figure 14b

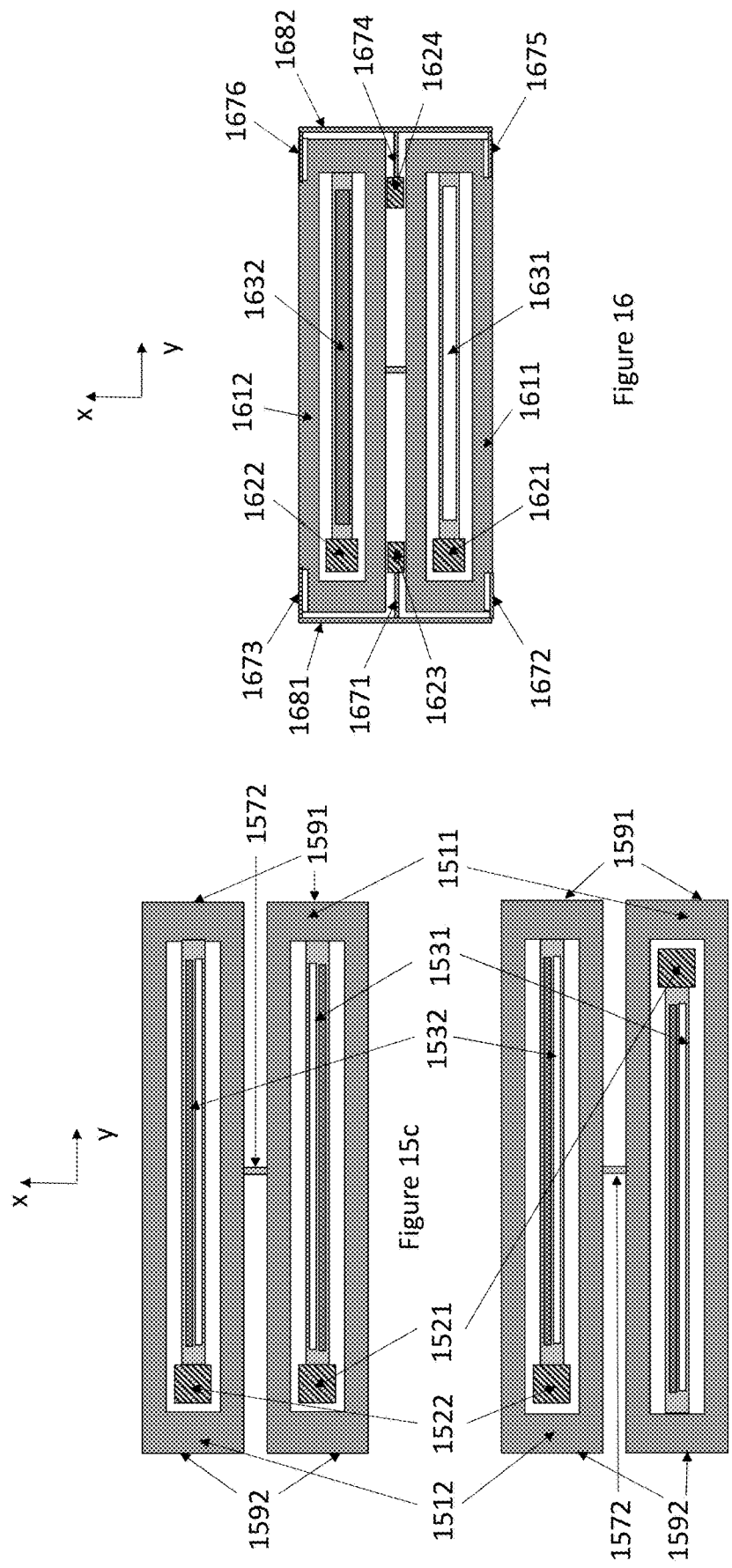

PIEZOELECTRIC ROTATIONAL MEMS RESONATOR

FIELD OF THE DISCLOSURE

The present disclosure relates to MEMS resonators, and more particularly to MEMS resonators where one or more mass elements are driven into rotational motion by piezoelectric actuation or where the rotational motion of one or more mass elements is detected by piezoelectric means. The present disclosure further concerns gyroscopes and clock oscillators implemented with piezoelectric rotational MEMS resonators.

BACKGROUND OF THE DISCLOSURE

The resonators described in this disclosure comprise an inertial mass element suspended from at least one spring structure. The inertial mass element is set into primary oscillating motion by a periodic actuating force. It can be mechanically coupled to other mass elements.

FIG. 1 shows a simplified illustration of a MEMS resonator structure. An inertial mass 11 is suspended from a fixed frame 12 by suspenders 13. In this disclosure a "fixed" object means an object which is much larger than the MEMS resonator structure, such as the supporting base upon which the MEMS structures are formed, or alternatively an object which is securely attached to the much larger structure and incapable of moving in any direction in relation to this structure. The term "anchor point" refers to a region where partly mobile objects such as suspenders may be attached to a fixed object. The term "attachment point" refers to a region where two objects, either fixed or mobile, are attached to each other.

In this disclosure a "suspended" object means an object which is attached to a fixed base via flexible means such as springs or beams. In silicon-based MEMS applications, these springs and beams typically comprise regions of silicon which are thin in at least one dimension, so that they are flexible enough to be bent or twisted by the movement of an actuator, or by the movement of an inertial mass to which they are attached. In piezoelectric MEMS applications, in particular, these springs and beams are flexible enough to be bent or twisted by piezoelectric transducers. In this disclosure the term "suspender" will be used as a general term for a spring or beam which attaches a mobile inertial mass to a fixed object.

The inertial mass 11 in FIG. 1 may rotate in relation to its depicted initial rest position in the xy-plane in two different modes. In this disclosure, the term "in-plane oscillation" refers to rotational oscillation about the z-axis in FIG. 1. The term "out-of-plane oscillation" refers to rotational oscillation about any axis in the xy-plane, such as the y-axis, for example. The plane defined by the rest position of the inertial mass 11 (which coincides with the plane of the frame 12 in FIG. 1) will also be called the "mass plane" or "inertial mass plane".

The coordinate system indicated in the Figures of this disclosure includes a y-axis parallel to the longitudinal direction of the inertial mass and a transversal x-axis which is orthogonal to the y-axis and lies in the mass plane. The longitudinal dimension of the inertial mass is typically larger than its transversal dimension in this disclosure. The vertical z-axis is orthogonal to both the y-axis and the x-axis. As mentioned, the mass plane is defined by the rest position of the inertial mass. In other words, the mass plane in a resonator is parallel to the top surface of an inertial mass when the inertial mass is not in motion. "In-plane" rotation refers in this disclosure to rotational movement within the mass plane, while "out-of-plane" rotation refers to rotational movement out of the mass plane.

The actuating force which sets an inertial mass in motion in MEMS resonators is typically either electrostatic or piezoelectric. An exemplary setup for piezoelectric actuation is illustrated in FIG. 2. The inertial mass 21 is in this case shaped like a frame with a central opening and a fixed anchor point 22 within the central opening. The inertial mass is suspended from the anchor point 22 by suspenders 231 and 232. One end of each suspender is attached to the anchor point 22 at its first attachment point 241, 242, and the other end is attached to the inertial mass at its second attachment point 251, 252. The suspenders 231 and 232 are coated with piezoelectric transducers which can generate both in-plane and out-of-plane oscillation, as will be described in more detail below. Electrical contacts may be drawn to these transducers for example through the anchor point 22 or through separate loose springs dedicated for this purpose.

Piezoelectric transducers on suspenders can be used (firstly) to set and maintain the inertial mass in motion, and (secondly) to detect the motion of the inertial mass. In this disclosure the prefix "drive" will be used for all mechanical and electrical means and methods which relate to setting and maintaining the inertial mass in rotational oscillation. The prefix "sense" will be used for the mechanical and electrical means and methods which relate to detecting the rotational oscillation of the inertial mass.

In this disclosure piezoelectric transducers which drive the resonator are called drive transducers. When a drive voltage is applied to the drive electrodes of a drive transducer, the transducer bends the suspender on which it is located. This bending movement sets the inertial mass in motion. When an alternating drive voltage is set to a suitable frequency, the inertial mass will undergo rotational oscillation in resonance.

Piezoelectric transducers which sense the movement of the inertial mass are called sense transducers in this disclosure. Sense transducers may be attached either on suspenders which are connected to the same inertial mass to which a drive transducer is attached, or on suspenders which are connected to other inertial masses which are mechanically coupled to the inertial mass driven by a drive transducer. The oscillating movement of the inertial mass bends the suspender on which the sense transducers is located, and this generates charge accumulation of opposite sign in sense electrodes on the two sides of the transducer. A sense voltage signal, whose amplitude is proportional to the amplitude of the oscillating motion of the inertial mass, and whose frequency is the same as oscillation frequency of the inertial mass, can be read from the sense electrodes.

Piezoelectric drive transducers and sense transducers may be located either on separate suspenders or on the same suspenders, as described in more detail below. A transducer may sometimes be used as a drive transducer, and sometimes as a sense transducer. In this disclosure, the transducer may be said to operate in "drive mode" in the former case, and in "sense mode" in the latter case.

FIG. 3 illustrates three cross-sections of a bending piezoelectric transducer for out-of-plane-bending. The transducer includes a layer of piezoelectric material and two electrode layers deposited on a silicon suspender 31. The transducer has an oblong shape in the x-y-plane. The transducer includes a first electrode layer 34, a layer of piezoelectric material 32 and a second electrode layer 33. The layers 34, 32 and 33 together form a piezoelectric transducer. The silicon beam 31 bends out of the xy-plane when a drive voltage is applied to the electrodes. Conversely, a sense voltage signal can be read from electrode layers 33 and 34 if the suspender 31 is bent out of the xy-plane by an external force.

FIG. 4 illustrates three cross-sections of a bending piezoelectric transducer for in-plane-bending. This transducer includes a silicon beam 41 and a pair of first electrode layers 441 and 442, one on the upper side of the layer of piezoelectric material 42 and one on the lower side (up and down refers in this case to the direction of the z-axis). These electrodes are paired with second electrode layers 431 and 432, respectively, as illustrated in the figure. Layers 441, 42 and 431 together form a first piezoelectric transducer and layers 442, 42 and 432 together form a second piezoelectric transducer.

When drive voltages with opposite polarity are applied to the two transducers, the average y-axis strain is zero, so the transducer does not bend out of the xy-plane. However, the two transducers produce opposite strains in the xy-plane, which bends the silicon beam 41 within this plane. If the transducers are used as sense transducers, in-plane bending will generate a voltage differential between the two transducers, but out-of-plane bending will not.

The drawing conventions in FIGS. 3 and 4 will be employed throughout this disclosure to illustrate transducers for out-of-plane bending and in-plane bending, respectively. In other words, a single rectangle on a suspender will be used to indicate an out-of-plane transducer, while two parallel rectangles on a suspender of opposite colour will be used to indicate an in-plane transducer. These two parallel rectangles will primarily be referred to in the singular, as a single "in-plane transducer", even though the structure is actually a split construction comprising two transducers, as explained above. Grey and white colours on transducers indicate polarity.

The piezoelectric layer (32, 42), which may be an aluminium nitride (AlN) layer, is typically not thicker than a few micrometers. The thickness of the silicon beam (31, 41) may, for example, be 50 µm.

In MEMS resonators piezoelectric transducers typically cannot be attached directly to the inertial mass because it is too rigid. They may instead be coated on the springs or beams from which the inertial mass is suspended, as explained above. A piezoelectric transducer therefore transduces kinetic energy to or from the spring or beam, rather than to or from the inertial mass, as capacitive transducers typically do. This means that the dimensions of the suspenders become crucially important in piezoelectric resonators.

When a layer of piezoelectric material is bent by an external force, positive charges accumulate on one side of the layer and negative charges on the other. Periodically oscillating bending movements create an oscillating electric field, which can be measured as an alternating sense voltage signal from a sense transducer.

Document WO2011136972 discloses a piezoelectric rotational resonator where piezoelectric transducers are placed on suspenders which suspend an inertial mass from a central anchor point.

The suspenders which carry sense transducers do not necessarily bend with a uniform curvature along their entire length when the inertial mass is in resonance oscillation. The bending modes of a sense transducer depend on the resonance frequency of the resonator, on the dimensions of the suspender, and on how the suspender is attached to the oscillating inertial mass.

FIG. 5 illustrates how suspenders 231 and 232 bend in the prior art resonator depicted in FIG. 2 when the inertial mass 21 undergoes out-of-plane rotation about the x-axis and the suspenders are attached inflexibly at first and second attachment points 241, 242 and 251, 252. Inflexible attachment at second attachment points 251, 252 forces the outer ends of the suspenders 231 and 232 to move as guided ends. In other words, at second attachment points 251, 252 the suspenders 231 and 232 are impacted not only by the point load force which arises from the rotating inertial mass, but also by a bending moment load which maintains the suspender in a constant angle in relation to the inertial mass 21. This makes the suspenders 231 and 232 bend into an S-shaped form which creates a charge reversal approximately ⅔ of the way between attachment points 241, 242 and 251, 252 as illustrated in FIG. 5. The signs in FIG. 5 represent the sign of the surface stress along the suspender on each side of it. If the upper surface of the suspender is coated by the transducer, the signs can also signify the sign of the charge at each side of the transducer.

This is not an optimal bending mode because the sense voltage signal is lowered when charges of opposite sign cancel out in each sense electrode. The problem may be alleviated by coating one suspender with two separate sense transducers to counter the charge reversal, but this requires complicated contacting arrangements. The same problem occurs during in-plane rotation. Inflexibly attached suspenders 231 and 232 assume an S-shaped form in the xy-plane as the inertial mass rotates about the z-axis.

Another problem which arises from inflexible attachment and S-shaped bending is that the relationship between external force and suspender displacement becomes non-linear. In other words, the bending is not characterized by a single spring constant. In case of a drive transducer and high amplitude oscillation produced at resonance, the nonlinearity will lower the resonant frequency of oscillation when the amplitude is increased. This effect is undesirable in applications where frequency stability or frequency tracking between two resonators is aimed at, as is the case for reference oscillators and gyroscopic sensors. Also, the energy losses will increase and the effective Q-value will thus decrease due to the nonlinearity since part of the energy of the oscillation is irreversibly converted to higher harmonic frequencies.

A third problem with the state of the art suspender and attachment is the relatively high spring constant produced by the S-shape mode of bending of the suspender. It would be beneficial to reduce the spring constant for given spring dimensions because it would allow shrinking the device area to achieve the same resonant frequency with a smaller device.

The first technical problem relating to suspender bending modes has been described above from the perspective of sense transducers. In other words, the inertial mass was assumed to produce the external force which bends the suspender in a certain manner. However, the same technical problems arise in drive transducers, because the inertial mass cannot be driven to oscillate in resonance unless the suspender assumes the bending mode which the resonance oscillation of the inertial mass dictates. When the oscillation of the inertial mass approaches and eventually reaches resonance, the bending of the suspender, and consequent charge accumulation, will be almost entirely dictated by this oscillation.

In other words, although the mechanical actuation of the drive transducer and the force arising from the resonating inertial mass always act together, and bend the suspender together, the force arising from the resonating inertial mass is by far the stronger determinant when the inertial mass oscillates in resonance. The bending mode must adapt to the resonating movement.

The technical problems outlined above have in part retarded the development of piezoelectric rotational resonators. Electrostatically driven and sensed resonators have predominated even though they require high bias voltages, consume more surface area than piezoelectric resonators and produce a capacitive output signal which is inversely proportional to the operating frequency. Piezoelectric transduction could improve the performance of a resonator on all of these counts, but suspender design becomes critical. It would be beneficial for the operation of both drive transducers and sense transducers if the resonant bending mode of the suspender would exhibit a more uniform charge distribution along the length of the transducer.

BRIEF DESCRIPTION OF THE DISCLOSURE

An object of the present disclosure is to provide an apparatus and method to alleviate the above disadvantages.

The objects of the disclosure are achieved by apparatuses which are characterized by what is stated in the independent claims. The preferred embodiments of the disclosure are disclosed in the dependent claims.

The disclosure is based on the idea of suspending the inertial mass from one or more anchor points with one-sided cantilever suspender arrangements, where the inertial mass is suspended from only one longitudinal suspender. However, the anchor points and suspenders should be placed in suitable locations in relation to the effective center of gravity of the inertial mass to optimize the bending mode of the suspender.

BRIEF DESCRIPTION OF THE DRAWINGS

The disclosure will be described in greater detail with reference to the accompanying drawings, in which

FIG. 5 illustrates the bending mode of a prior art suspender when the inertial mass oscillates in resonance.

FIG. 6 illustrates a rotational resonator according to a resonator embodiment.

FIG. 7 also illustrates a rotational resonator according to a resonator embodiment.

FIGS. 14a-14b illustrate suspenders coated with multiple transducers.

FIGS. 15a-15d illustrate a first resonator system embodiment.

FIG. 16 illustrates a second resonator system embodiment.

DETAILED DESCRIPTION OF THE DISCLOSURE

Resonator Embodiment

Figure 2:
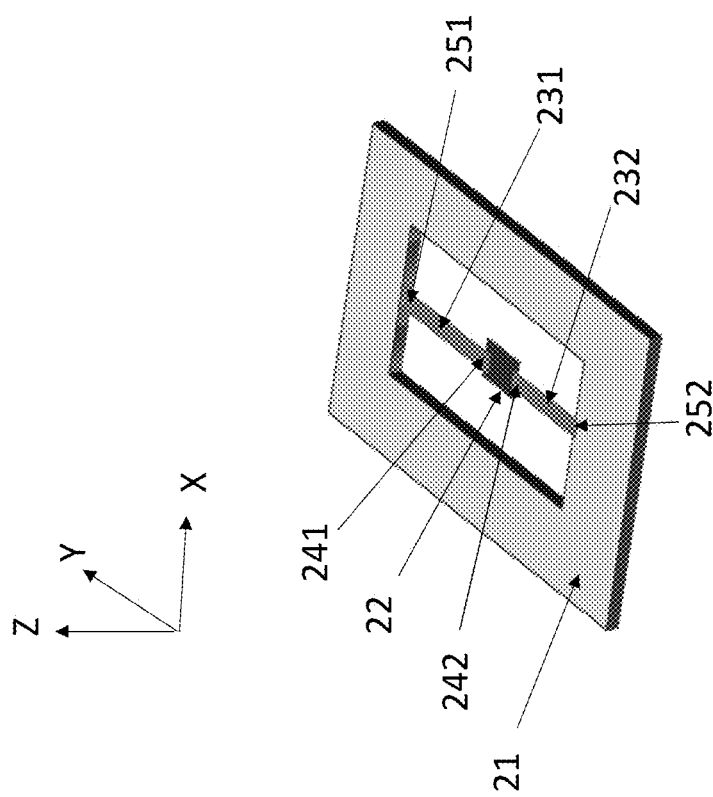
FIG. 2 illustrates a simple piezoelectrically driven resonator.
Figure 1:
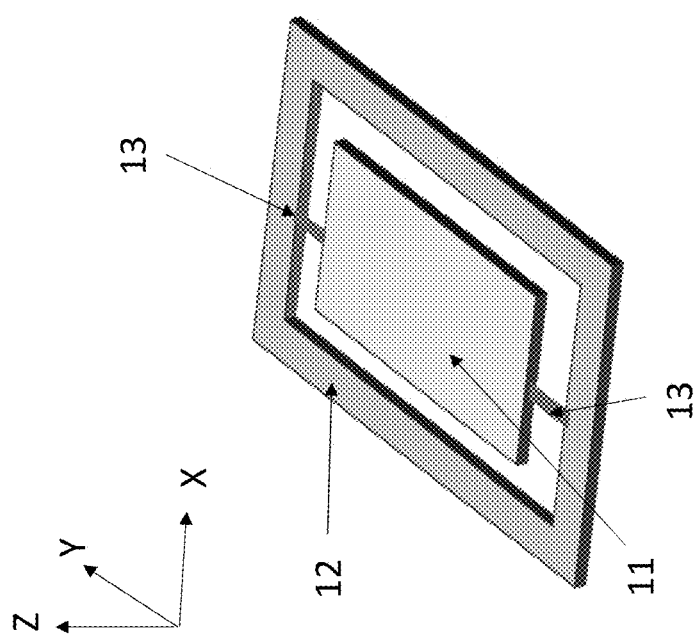
FIG. 1 illustrates a simple resonator.
Figure 3:
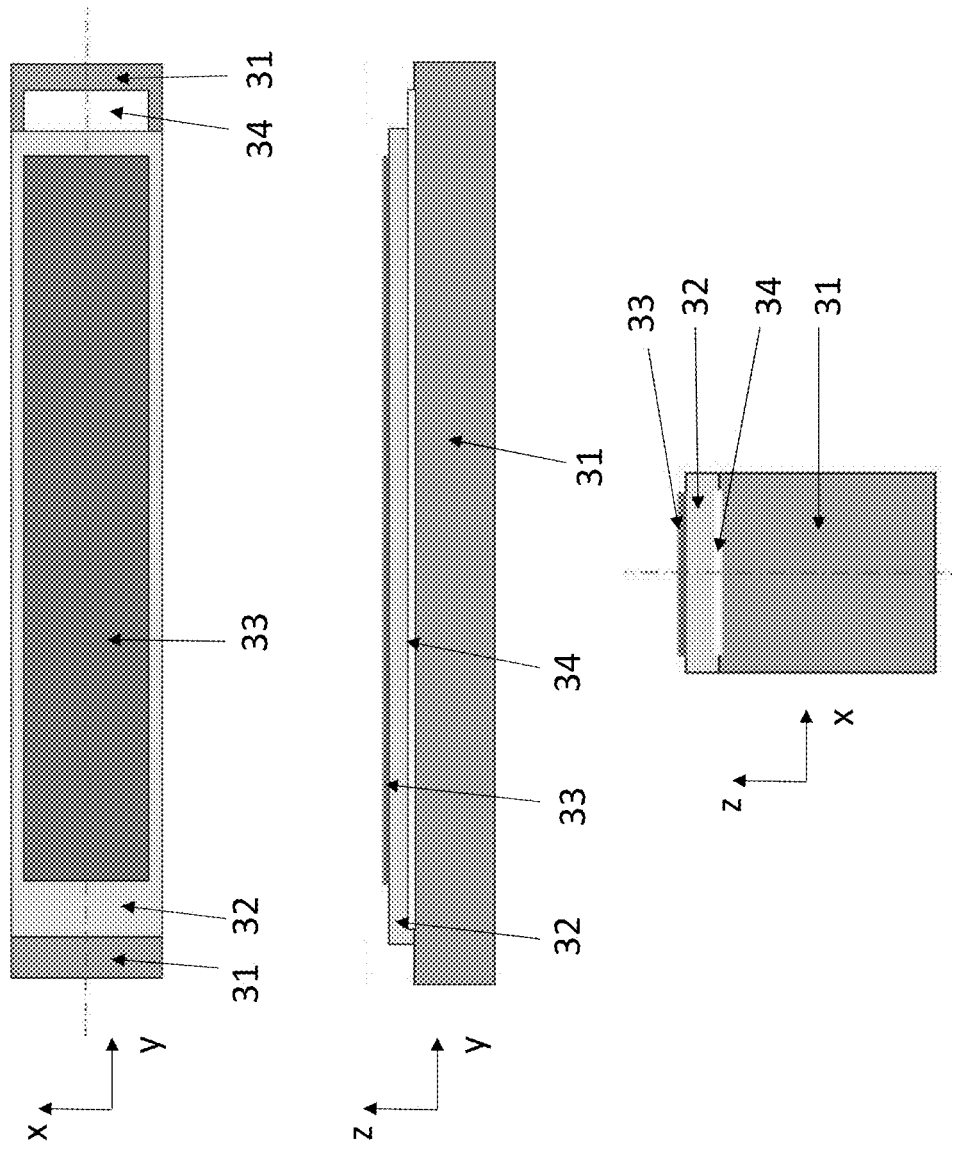
FIG. 3 illustrates an out-of-plane piezoelectric transducer on a suspender.
Figure 4:
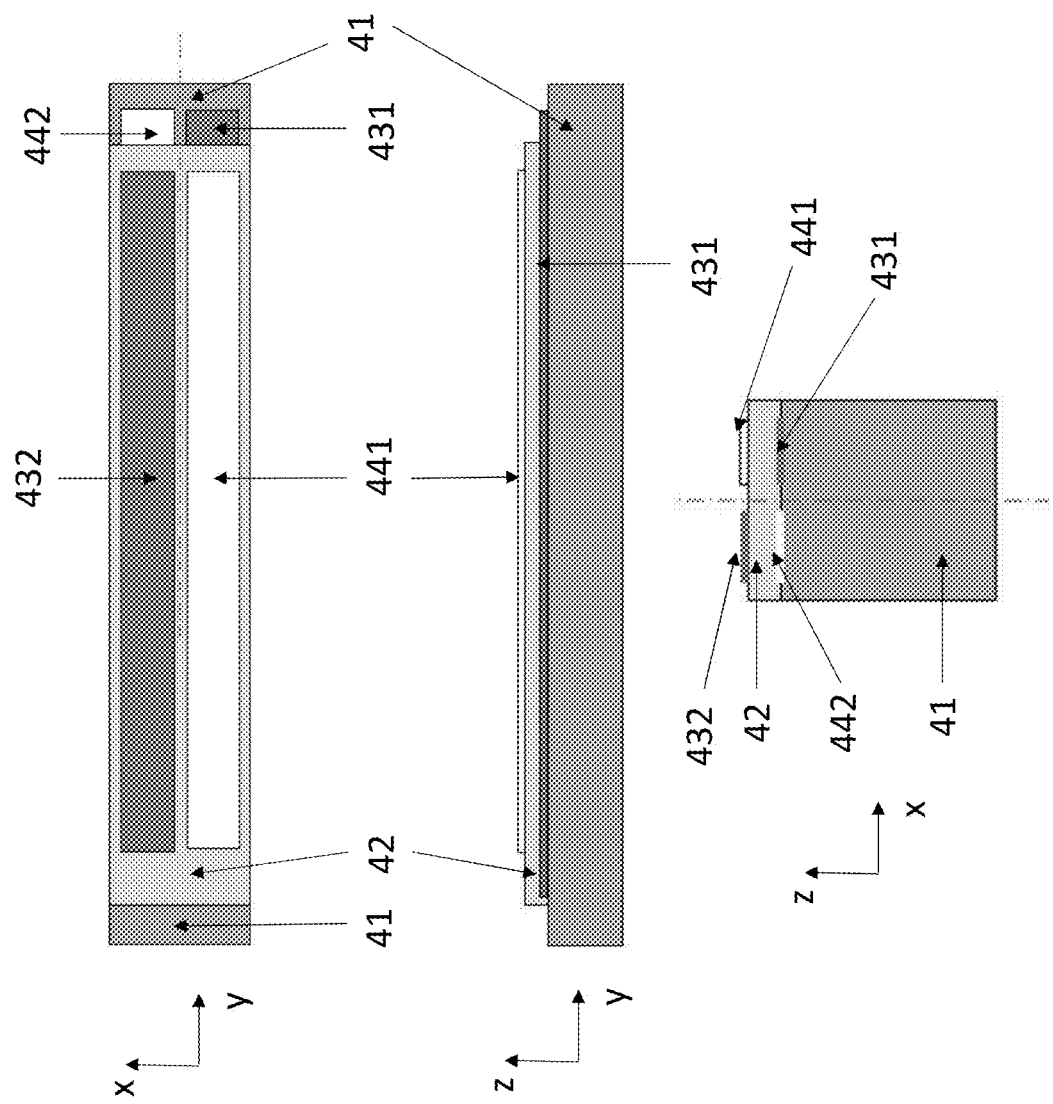
FIG. 4 illustrates an in-plane piezoelectric transducer on a suspender.

This disclosure describes a rotational resonator comprising a substrate with one or more anchor points and an inertial mass with a first longitudinal end and a second longitudinal end. The inertial mass is suspended from the one or more anchor points by one or more suspenders extending from the one or more anchor points toward either the first longitudinal end or the second longitudinal end of the inertial mass. One or more of the suspenders are coated with a piezoelectric transducer structure configured to drive or detect oscillating rotary movement in the inertial mass. No more than one suspender is attached to any of the anchor points. The longitudinal length of each coated suspender is 0.5-1 times the longitudinal length of the inertial mass.

When piezoelectric transducers described in this disclosure are used in the sense mode, the best signal-to-noise ratios may be achieved when the transducer capacitance equals the sum of the capacitance of the external connections and the input capacitance of the amplifier, which usually amounts to a few pF. The capacitance of the transducer is determined by its area and by the thickness of the piezoelectric layer. It can be shown that if the piezoelectric layer is a 0.8 µm thick AlN layer, then the aspect ratio of the transducer in the xy-plane (in other words, its longitudinal length in the y-direction divided by its transversal breadth in the x-direction) should be in the range 5-20, preferably in the range 10-15 to achieve transducer capacitances in the range 2-5 pF at typical MEMS resonator frequencies (20-50 kHz) with an inertial mass whose aspect ratio (2-20, preferably 5-10) and thickness (20-50 µm) are in practical ranges. The required transducer area in the xy-plane will be approximately 0.05 mm$^2$ with a 0.8 µm thick AlN layer. This area may, for example, be obtained with dimensions of 1000 µm×50 µm. The piezoelectric transducers described in this disclosure, and the suspenders on which they are coated, therefore have oblong shapes with aspect ratios in the range 5-20, preferably in the range 10-15.

The size and dimensions of the inertial mass may be chosen more freely because multiple suspenders can be attached to the mass if it is large, as illustrated in this disclosure. The inertial masses depicted in this disclosure also have oblong shapes, but their aspect ratio may be smaller than the aspect ratios of the transducers and suspenders. An inertial mass may have two longitudinal ends on two opposing sides of an anchor point. The longitudinal ends are separated in the y-direction by a longitudinal length. An inertial mass may also have two transversal sides on two opposing sides of an anchor point, separated in the x-direction by a transversal breadth. However, in some embodiments the inertial mass may be asymmetric, so that it only has one transversal side on one side of the anchor point.

FIG. 6 illustrates a first rotational resonator. The resonator comprises an inertial mass 61 and an anchor point 62. The inertial mass has a first longitudinal end 691 and a second longitudinal end 692. The longitudinal length of the inertial mass 61 is the distance $L_1$ between the two longitudinal ends. The inertial mass 61 is suspended from the anchor point 62 by a suspender 63. The suspender is attached to the anchor point at a first attachment point 64 and to the inertial mass at a second attachment point 65. The longitudinal length of the suspender is in this case the distance $L_2$ between the first and second attachment points. The suspender has been coated with a piezoelectric transducer structure configured for in-plane bending. The suspender 63 extends in the longitudinal y-direction from the anchor point 62 toward the first longitudinal end 691 of the inertial mass 61. Only one suspender 63 is attached to the anchor point 62, so the inertial mass 61 is suspended from only one suspender. The longitudinal length of inertial masses and suspenders is defined in the above manner in all embodiments described in this disclosure, even though distances $L_1$ and $L_2$ are not explicitly indicated in every Figure.

FIG. 7 illustrates a second rotational resonator according to this resonator embodiment. The components indicated with reference numbers 71-75 and 791-792 correspond to the ones indicated with reference numbers 61-65 and 691-692 in the first resonator. The only difference to the first rotational resonator is that the suspender has been coated with a piezoelectric transducer structure configured for out-of-plane bending.

When no more than one suspender is attached to any anchor point, none of the anchor points exhibits the two-sided suspender arrangement illustrated in FIG. 2, where one suspender extends from the anchor point toward the first longitudinal end of the inertial mass and another suspender extends from the same anchor point toward the second longitudinal end of the inertial mass. In other words, the number of suspenders attached to each anchor point is one, or, if the substrate contains some anchor points which are not in active use, then the number of suspenders attached to each anchor point is either zero or one. In a two-sided suspender arrangement the bending of each suspender is partly constrained by the other suspender attached to the same anchor point, whereas in a one-sided suspender arrangement each suspender acts more like a cantilever whose bending mode is determined only by the resonance movement of the inertial mass.

A first technical benefit arising from the use of a one-sided cantilever suspender, where no more than one suspender is attached to any anchor point and the longitudinal length of each coated suspender exceeds half the longitudinal length of the inertial mass, but is shorter than the longitudinal length of the inertial mass, is that the spring constant of the suspender is smaller in a one-sided cantilever suspender than in a two-sided suspender arrangement on opposing sides of an anchor point. A second benefit compared to two-sided suspender arrangements is that the same resonant frequencies can be obtained with a resonator whose total surface area in the inertial mass plane is smaller. It can be shown, with reasonable assumptions for suspender thickness and width, that a resonator with a one-sided cantilever suspender can have 50% less surface area in the mass plane than a resonator with a two-sided suspender arrangement, and still obtain the same resonant frequency.

The dimensions of the suspender influences the signal-to-noise ratio significantly, as discussed above. However, the size of the inertial mass must also be sufficiently large to generate enough bending moment at the second attachment point of the suspender. When the longitudinal length of each coated suspender is 0.5-1 times the longitudinal length of the inertial mass, the surface area of the suspender and the bending moment at the second attachment point both become sufficiently large to generate a strong signal in the suspender.

Additional benefits can be gained if the effective center of gravity of the resonator coincides, or at least approximately coincides, either with the rotational axis of the resonator or with a transversal line which crosses the rotational axis of the resonator. If the suspenders have even transversal breadth and vertical height profiles, the longitudinal distance on each coated suspender from the anchor point to which it is attached to the transversal line which passes through the effective center of gravity of the inertial mass may, for example, be 0.4-0.6 times, or 0.49-0.51 times, the length $L_2$ of the coated suspender. When the rotation axis of the inertial mass coincides with the center of gravity the motion is pure rotation, i.e. the inertial mass has no linear translation at all and the suspender has a constant bending moment at all locations.

Figure 8:
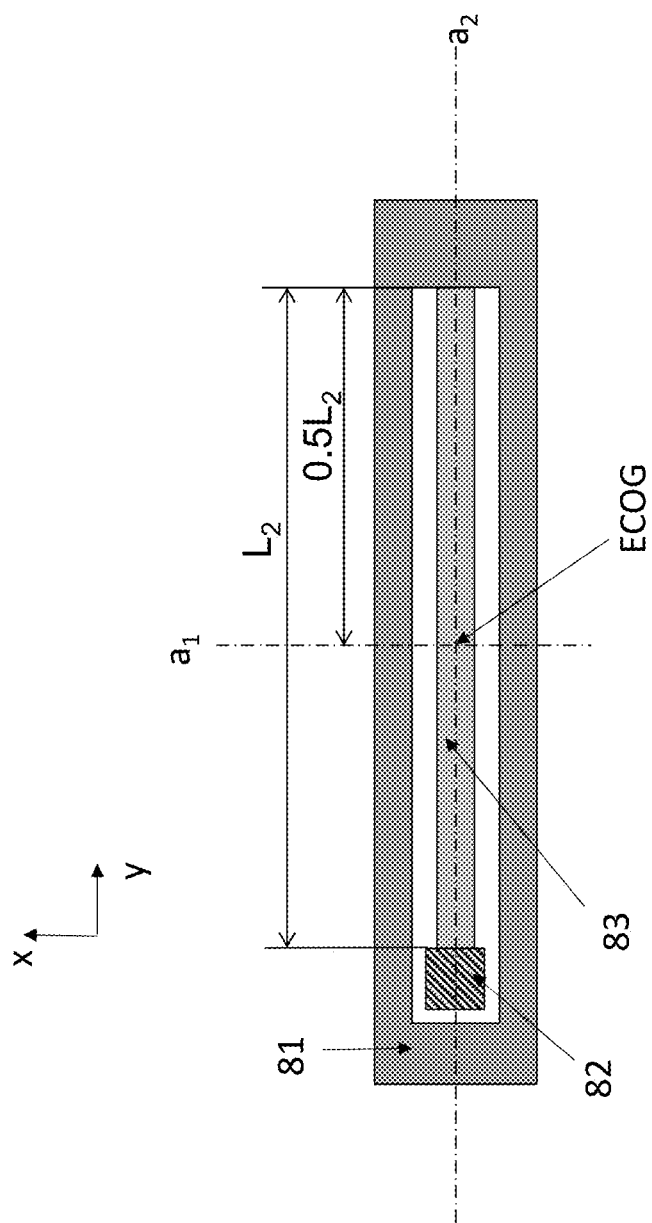
FIG. 8 illustrates the longitudinal distance between the anchor point and the effective center of gravity.

FIG. 8 illustrates the longitudinal distance between the anchor point 82 and the effective center of gravity (ECOG) of the inertial mass. The line $a_1$ is the transversal line which passes through the effective center of gravity, and $a_2$ is the longitudinal line which passes through the effective center of gravity. The anchor point 82 is located on the line $a_2$ in FIG. 8. The anchor points may not be located on this line in embodiments where the inertial mass is suspended from multiple suspenders, as explained below. The distance from the anchor point 82 to the transversal line $a_1$ is 0.5 $L_2$, where $L_2$ is the length of the suspender 83. The distance from the opposite end of the suspender to the transversal line $a_1$ is then also 0.5 $L_2$.

Figure 9:
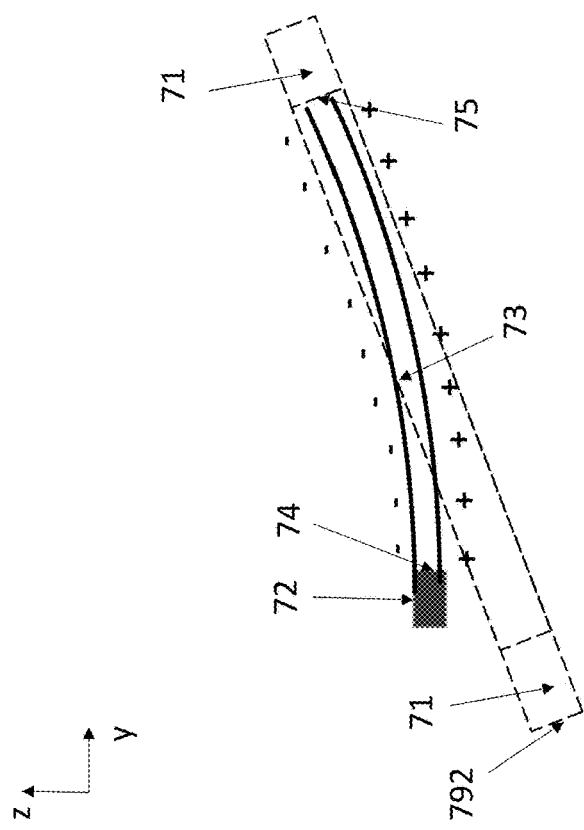
FIG. 9 illustrates the bending mode of a suspender when the longitudinal distance from the anchor point to the transversal line which passes through the effective center of gravity is in the claimed range.

FIG. 9 illustrates the bending mode of the coated suspender 73 when the longitudinal distance from the anchor point 72 to which it is attached, to the transversal line which passes through the effective center of gravity, is in the claimed range and the inertial mass 71 undergoes out-of-plane rotation. The curvature of the suspender 73 becomes constant along its entire length due to constant bending moment. In the transducer on the coated suspender the constant curvature results in a uniform surface stress and uniform charge accumulation along the length of the suspender 73, as illustrated in FIG. 9 with uniformly distributed plus and minus signs along the length of the suspender. The same uniform charge accumulation would be produced in the coated suspender 63 when inertial mass 61 undergoes in-plane oscillation.

The term "effective center of gravity" refers to the fact that the inertial mass and the suspender move together, and the weight of the suspender may not be negligible in comparison to the weight of the inertial mass. However, since one end of the suspender is fixed, only part of the suspender will contribute a mobile mass component to the oscillating motion. Balanced rotation around a rotation axis requires that the combined effective center of gravity of the suspender and the inertial mass lies on, or at least close to, the rotation axis. The effective center of gravity must be calculated with a physical model of the resonator.

The term "effective" refers, firstly, to the fact that the additional mass contributed by the suspender to the total mobile mass varies as a function of its degree of bending. The mobile weight which is added to the resonator due to the movement of the suspender may be modelled as an effective mass located at the second attachment point where the suspender is attached to the inertial mass, such as point 75 in FIG. 9. This calculated correction takes into account the additional mass which becomes mobile in the resonator due to the kinetic energy of the partly moving suspender and added kinetic energy due to the possible flexibility of the inertial mass.

Secondly, the term "effective" also refers to the fact that the inertial mass may not be entirely rigid in its longitudinal direction, and an additional weight component dependent on the degree of bending may have to be calculated to take this flexibility into account, especially in out-of-plane oscillation. For example, in the inertial masses depicted in FIG. 9, the portion of the inertial mass which is close to the second longitudinal end 792 of the inertial mass (and far from second attachment point 75 where the suspender is attached to the inertial mass) may bend slightly away from the longitudinal symmetry line of the inertial mass when the inertial mass oscillates. The mobile weight which is added to the resonator by this bending may be modelled as an effective mass located at the second longitudinal end 792.

The effective center of gravity of the inertial mass during in-plane oscillation may not coincide with the effective center of gravity during out-of-plane oscillation, and neither of them may coincide with the center of gravity when the inertial mass is still. It may therefore not be possible to make the center line of a coated suspender cross the effective center of gravity of both in-plane and out-of-plane motion. In other words, recalling that the resonator in FIG. 6 oscillates in-plane while the resonator in FIG. 7 oscillates out-of-plane, even if inertial masses 61 and 71 would have exactly equal mass distributions and coated suspenders 63 and 73 would also have an exactly equal mass distributions, the suspenders 63 and 73 may still have to be placed differently in relation to the inertial mass to make the longitudinal distance from the anchor point to the transversal line which passes through the effective center of gravity of the inertial mass equal or almost equal to 0.5 times the length of the coated suspender.

Suspenders which are coated with transducers for only one oscillation mode (in-plane or out-of-plane) can be designed so that the location of the effective center of gravity is optimized for this mode. In embodiments where an in-plane transducer and an out-of-plane transducer are placed on the same suspender, such as the ones illustrated in FIGS. 14a-14b, 19 and 20 below, the location of the effective center of gravity may have to be optimized for one oscillation mode (in-plane or out-of-plane) at the expense of the other. If suspenders of this kind are used in a gyroscope, the oscillation which corresponds to the sense mode may be prioritized.

The technical benefit of positioning a coated suspender in such a way that the longitudinal distance on each coated suspender from the anchor point to which it is attached to the transversal line which passes through the effective center of gravity of the inertial mass is in the claimed range is that the rotation axis of the oscillating motion and the middle of the coated suspender lie either on or very close to the same transversal line. This makes the translational forces imparted by the inertial mass on the coated suspender at the second attachment point zero or very close to zero.

The bending mode of the coated suspender can then be characterized as nearly pure rotation, where the inertial mass imparts only a bending moment to the suspender at the second attachment point as it oscillates in resonance. This motion bends the suspender into a parabolic shape because the local radius of curvature of the suspender is proportional to the local bending moment, and the local bending moment is constant along the length of the suspender when it is fixed at the first attachment point and turned only by a bending moment at the second attachment point.

In other words, when the distance on a coated transducer from the anchor point to the transversal line which passes through the effective center of gravity is in the claimed range, and when the inertial mass is in resonance oscillation, a strong sense signal can be read from a sense transducer on the suspender because charge accumulation is uniform along its entire length, as illustrated in FIG. 9. Conversely, if the transducer is used as a drive transducer, the oscillatory motion imparted by the drive voltage will be in harmony with the motion imparted by resonating inertial mass because bending with uniform curvature is the normal bending mode of an unattached bending transducer.

The advantages obtained with from even charge distribution in the transducer include highly linear bending modes for the suspender, with low spring constants, as well as high piezoelectric transducer capacitances and smaller resonator size. In gyroscope and clock oscillator applications these benefits facilitate small motional resistance, high coupling factors, reliable start-up and high signal-to-noise ratios in the sense voltage signal, and smaller size.

Another advantage of the invention is that the effect of external linear vibration to the resonance motion is zero if the motion of the inertial mass is pure rotation. This can be used to improve the vibration robustness of the resonators.

Yet another benefit from the arrangement where suspenders are attached to anchors and to only one end of the inertial mass is that the rotation angle of the inertial mass is a very linear function of the applied torque. This is due to the fact that bending of the spring doesn't produce any tension in the spring that would increase the spring rate when the angle increases. Linear resonators will exhibit no change of resonant frequency at high amplitude and low mechanical loss.

The one-sided cantilever suspender arrangements described in this disclosure also facilitate smaller resonators than the two-sided prior art arrangements depicted in FIG. 2. It can be shown that a resonator with a one-sided cantilever suspender arrangement, which has a resonance mode where the inertial body rotates about an axis through its center of gravity, can be made 50% smaller than a resonator with a two-sided suspender arrangement which has a resonance mode with the same frequency where the inertial body also rotates about an axis through its center of gravity.

The preferred intervals for the longitudinal distance on each coated suspender from the anchor point to which it is attached to the transversal line which passes through the effective center of gravity of the inertial mass, which are 0.49-0.51 or 0.4-0.6 times $L_2$, are motivated as follows. Small deviations from 0.5 $L_2$ will make the inertial mass impart slight translational forces to each coated suspender at its second attachment point, which may make the inertial mass susceptible to external linear vibration. An approximate limit for securing a pure bending moment load in the suspender for both oscillation modes is when the distance from the midpoint to the transversal line which passes through the effective center of gravity is less than 1% of the length of the coated suspender. An approximate limit where the benefits pertaining to even charge accumulation in the transducer are lost is when the distance equals 10% of the length of the coated suspender.

Displacing the effective center of gravity (ECOG) from the rotation axis (RA) also makes the resonator more sensitive to external disturbances. The rotation axis of the inertial mass is transversal, in other words parallel to the x-axis, in out-of-plane bending. A longitudinal distance, hereafter referred to as the ECOG-RA distance, can in this case be measured from the transversal line which passes through the effective center of gravity to the rotation axis (RA). When the resonator oscillates in-plane, the rotation axis of the inertial mass is parallel to the z-axis. In this case the ECOG-RA distance can be measured from the transversal line which passes through the effective center of gravity (ECOG) of the resonator to the transversal line which passes through the rotation axis (RA) of the inertial mass.

If the ECOG-RA distance is nonzero and an out-of-plane resonator is exposed to external linear vibration, then the inertial mass will experience a torque about its rotation axis. If the resonator is utilized in a gyroscope coupled to another resonator in differential mode, the torque will force both inertial masses to rotate in the same direction about their rotation axis, and the output signal disturbances created by the linear vibration shock in the two transducers will cancel each other. However if the signal is too large it may overload the common mode capability of the input amplifier. Any asymmetry in the transducers, due to e.g. manufacturing tolerances, will produce a differential signal which is amplified as the output signal of the gyroscope. If, on the other hand, the ECOG-RA distance is nonzero and the same gyroscope is exposed to external rotational vibration about its longitudinal axis, then the torque will force the two inertial masses to rotate in opposite directions and the output signal disturbances will be added to each other. The disturbance cannot in this case be separated from the output signal due to the Coriolis force.

The ECOG-RA distance, which causes the disturbing torque, should preferably be minimized, but it may not always be possible to reduce it exactly to zero due to restrictions posed by manufacturing tolerances. Furthermore, as explained above, the effective center of gravity in out-of-plane oscillation may not exactly coincide with the effective center of gravity in in-plane oscillation, so the ECOG-RA distance may not be reducible to zero for both rotation modes in an inertial mass which is configured to undergo in-plane and out-of-plane oscillation simultaneously. However, an approximate limit for avoiding disturbances entirely is that the ECOG-RA distance for both oscillation modes should be reduced to less than 1% of the length of the coated suspender. An approximate limit where the resonator becomes too sensitive to external vibrations is when the ECOG-RA distance equals 10% of the length of the coated suspender.

A suspender in a rotational resonator may have an even transversal breadth profile in the x-direction and an even vertical height profile in the z-direction along the entire longitudinal length of the suspender. Alternatively, a suspender may have an uneven breadth profile or height profile, where the breadth/height varies as a function of distance along the suspender. Uneven profiles turn the moment of inertia into a function of distance, and the center of rotation of the suspender and the inertial mass will then also depend on the breadth and height profiles. For example, if the height varies linearly as a function of distance, it can be shown that center of rotation will deviate from the center of the suspender by approximately 10% if the ratio between the moments of inertia at the two ends of the beam is three.

In other words, if the suspender has even breadth and height profiles, it is generally preferable to give the suspender a longitudinal dimension and position where the centerline of the suspender, which is the transversal line which passes through the longitudinal coordinate 0.5 $L_2$, crosses the effective center of gravity and coincides with the rotation axis (if the inertial mass oscillates in the in-plane mode) or with the transversal line which crosses the rotation axis (if the inertial mass oscillates in the out-of-plane mode). Deviations of 1% in the longitudinal coordinate typically produce negligible losses, while deviations larger than 10% produce harmful losses which exceed the benefits. However, the suspender may have to be displaced from this position if the height or breadth profile of the suspender is uneven. The general requirement for obtaining a nearly pure bending moment load at the second attachment point of the suspender is that the distance from either the rotation axis (if the inertial mass oscillates in the in-plane mode) or from the transversal line which crosses the rotation axis (if the inertial mass oscillates in the out-of-plane mode) to the effective center of gravity of the resonator should not exceed 0.01 times the length of any of the coated suspenders at any point in the oscillation cycle. As mentioned before, an approximate limit where the drawback from sensitivity to external vibrations begin to outweigh the benefits explained above is when the distance exceeds 0.1 times the length of the coated suspender at some points in the oscillation cycle. Computer simulation is typically required for locating the effective center of gravity precisely.

Figure 10:
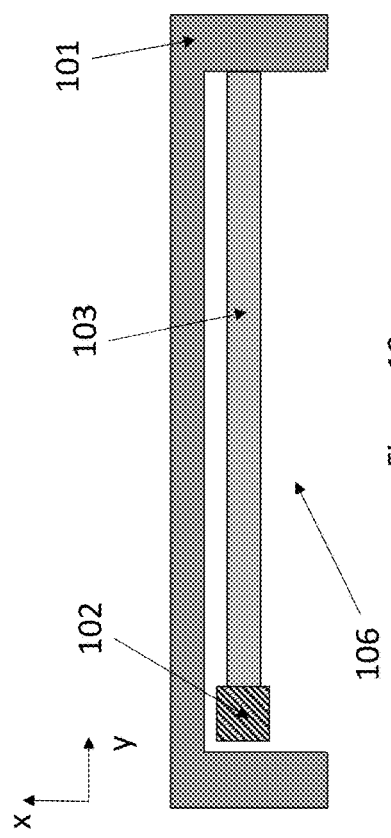
FIG. 10 illustrates an alternative shape for an inertial mass.
Figure 11:
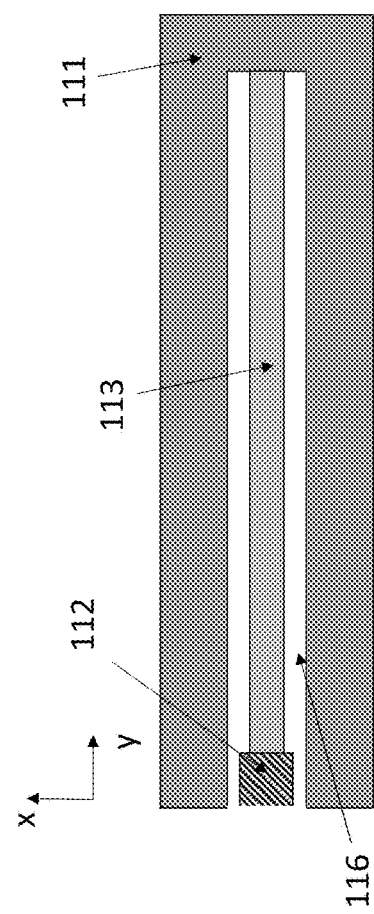
FIG. 11 also illustrates an alternative shape for an inertial mass.
Figure 12:
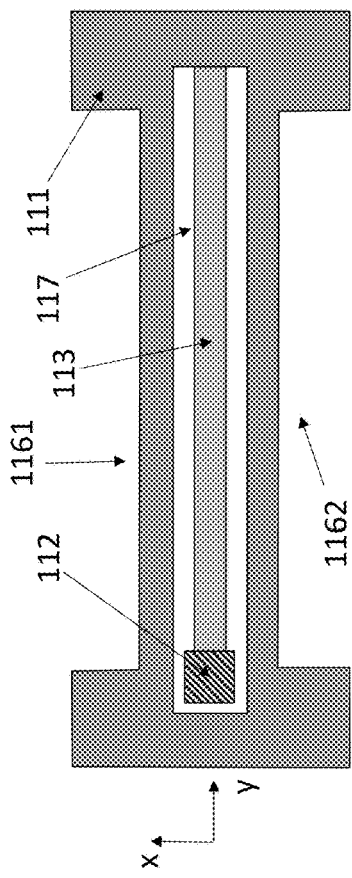
FIG. 12 also illustrates an alternative shape for an inertial mass.

In the preceding illustrations, the inertial mass has comprised one internal opening and one anchor point and one suspender is located in this internal opening. However, the inertial mass does not necessarily have to surround the anchor point and suspenders entirely. FIGS. 10 and 11 illustrate inertial masses 101, 111 which have external openings 106 and 116. Anchor points 102, 112 and suspenders 103, 113 are located in these external openings 106, 116 are not surrounded on all sides by the inertial masses 101, 111. Such shapes may, for example, facilitate easier electrical contacting to the transducers on the suspenders. FIG. 12 illustrates a third alternative shape for the inertial mass with one internal opening 117 and two external openings 1161 and 1162. The anchor point 112 and the suspender 113 have been placed within the internal opening 117. With the protrusions in each corner which form the external openings, the area of the inertial mass has been increased without shifting the center of gravity. The suspenders 103, 113 may be coated with transducers for either in-plane or out-of-plane oscillation.

Figure 13B:
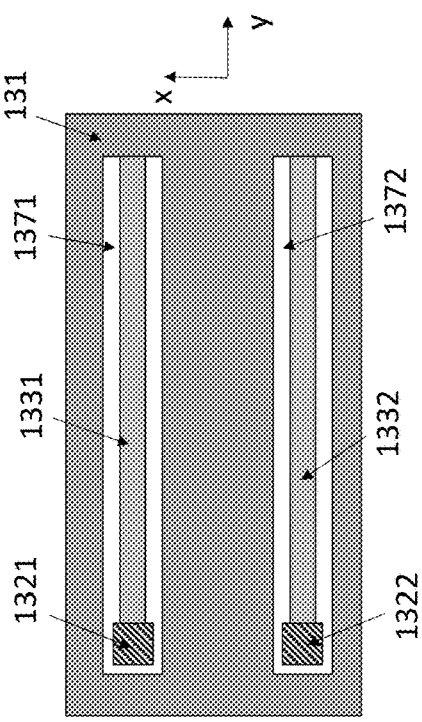
FIGS. 13a-13c illustrate alternative shapes for inertial masses attached to two suspenders.
Figure 13C:
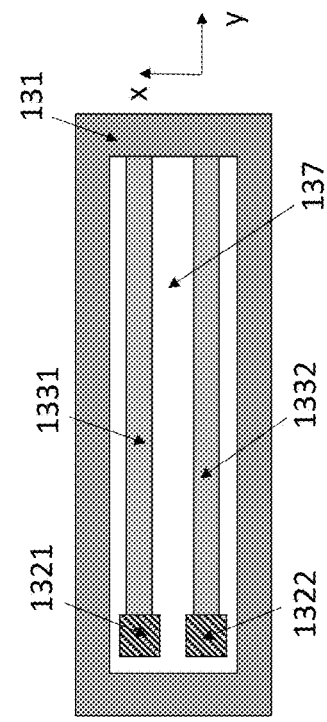
Figure 13A:
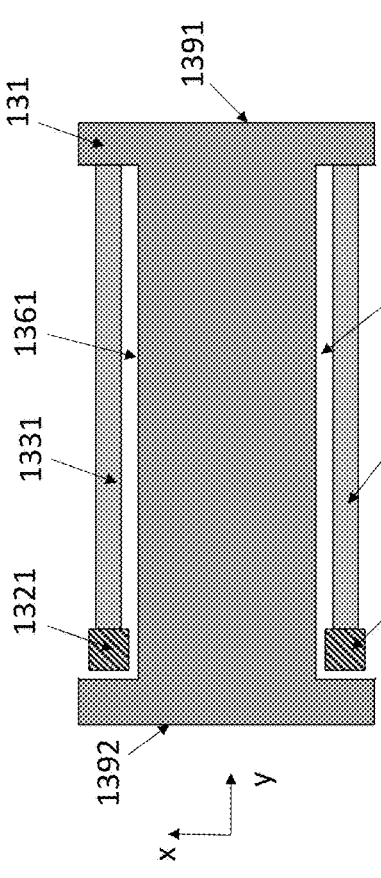

The resonator may comprise multiple suspenders and anchor points. FIGS. 13a, 13b and 13c all illustrate embodiments where an inertial mass 131 is suspended from two suspenders 1331, 1332 attached to two separate anchor points 1321, 1322. The suspenders 1331, 1332 may be coated with transducers for either in-plane or out-of-plane oscillation.

FIG. 13a illustrates an arrangement where the inertial mass comprises two external openings 1361, 1362, within which the anchor points 1321, 1322 and the suspenders 1331, 1332 have been placed. FIG. 13b illustrates an arrangement where the inertial mass comprises two internal openings 1371, 1372. Anchor point 1321 and suspender 1331 have been placed in the internal opening 1371, while anchor point 1322 and suspender 1332 have been placed in the internal opening 1372. FIG. 13c illustrates an arrangement where the inertial mass comprises one internal opening 137, within which both anchor points 1321, 1322 and suspenders 1331, 1332 have been placed. The inertial mass could also comprise several internal openings and several external openings, with one or more suspenders in each opening.

In FIGS. 13*a*-13*c* the suspenders 1331 and 1332 extend toward the same longitudinal end of the inertial mass from their respective anchor points 1321 and 1322 to the inertial mass 131. Alternatively, the anchor points 1321 and 1322 may be placed on opposite sides of both the transversal and the longitudinal symmetry lines $a_1$ and $a_2$ illustrated in FIG. 8, so that suspenders 1331 and 1332 extend toward opposite longitudinal ends from their respective anchor points. Suspender 1331 may extend toward a first longitudinal end 1391 and suspender 1332 toward a second longitudinal end 1392.

One suspender may be coated with multiple transducers. FIG. 14*a* illustrates a resonator where one suspender 1431 has been coated both with an in-plane transducer 1481 and with an out-of-plane transducer 1482. Each transducer occupies one half of the suspender. The resonator can simultaneously be driven to both in-plane oscillation and out-of-plane oscillation.

FIG. 14*b* also illustrates a resonator where one suspender 1432 has been coated both with an in-plane transducer 1483 and with an out-of-plane transducer 1484. In this case the transducers run in parallel along the entire length of the suspender, so that the out-of-plane transducer is located between the two split transducers 1483 which together constitute the in-plane transducer. The resonator can simultaneously be driven to both in-plane oscillation and out-of-plane oscillation.

In-plane and out-of-plane resonance frequencies are equal or very close to equal if the vertical thickness of the suspender 1431, 1432 in the z-direction is equal to its transversal width in the x-direction.

The resonators described and illustrated above all comprise suspenders which are straight beams of uniform width that extend all the way from the anchor point to the inertial mass. It is also possible to prepare a flexure at the end of the suspender, which connects the suspender to the inertial mass at the second attachment point (for example points 65 and 75 in FIGS. 6 and 7, respectively). The flexures can have in-plane and torsional flexibility. Folded beams and combinations of flexures may also be used.

First Resonator System Embodiment

Resonators with a single inertial mass are susceptible to disturbances arising from external vibrations. Rotational resonators are insensitive to linear external vibrations, but are still susceptible to rotary vibrations. They may also suffer from acoustic losses due to mechanical coupling between the inertial suspender and the fixed base of the resonator. This coupling is due to the torque exerted by the suspenders on the anchor point and thus on the fixed base, which in practice will not be totally fixed, but have a large but not infinite mass and thus a finite moment of inertia. If the fixed base is able to rotate even slightly, energy will leak out from the resonator and may be converted to heat if the support of the fixed base is attached by glue or other acoustically dissipative material or it is attached to an acoustically dissipative material such as plastic or composite material. The effect will be a lowered and greatly variable Q-value of the resonator depending on the properties of the materials of attachment. These problems may be circumvented in resonator systems which include two inertial masses. The two inertial masses may be mechanically coupled to each other to oscillate synchronously. Increased robustness and decreased losses may be obtained by driving the two inertial masses into anti-phase oscillation, where at any given time one mass rotates clockwise about a given axis when the other rotates at equal angular velocity counterclockwise about a parallel axis, and vice versa. The torques exerted by the two resonators on the fixed base will be equal but opposite and will cancel each other. The same benefits may be obtained on the sense side by reading a differential signal from the piezoelectric transducers. The effect of external vibrations on each resonator will be equal and by differential reading they will cancel each other. Any of the resonators described above may be utilized in a resonator system.

In a first resonator system embodiment, a rotational resonator system with first and second resonators comprises a substrate with one or more first anchor points and one or more second anchor points, and first and second inertial masses which are mechanically coupled to each other. Both inertial masses comprise a first longitudinal end and a second longitudinal end. The first inertial mass is suspended from the one or more first anchor points by one or more first suspenders extending from the one or more first anchor points toward either the first longitudinal end or the second longitudinal end of the first inertial mass. The second inertial mass is suspended from the one or more second anchor points by one or more second suspenders extending from the one or more second anchor points toward either the first longitudinal end or the second longitudinal end of the second inertial mass. At least one of the first suspenders and at least one of the second suspenders is coated with a piezoelectric transducer structure configured to drive or detect oscillating rotary movement in the inertial mass to which it is attached. No more than one suspender is attached to any of the one or more anchor points. The longitudinal length of each coated suspender is 0.5-1 times the longitudinal length of the inertial mass to which it is attached.

For reasons given above, either the rotation axis of each resonator or the transversal line which crosses the rotation axis of each resonator should preferably cross, or at least pass very close to, the effective center of gravity of said resonator. The distance from axis/line to the effective center of gravity should preferably not exceed 0.01 times the length of any of the coated suspenders at any point in the oscillation cycle.

FIGS. 15*a*-15*d* illustrate resonator systems where the number of anchor points is two and the number of suspenders is also two. Any of the resonators illustrated above could be implemented in a resonator system, and the number of anchor points and number of suspenders could thereby be multiplied without increasing the number of resonators. The illustrated resonator systems comprise a first anchor point 1521 and a first suspender 1531 attached to from its first attachment point to this anchor point 1521. The first 1531 suspender is attached from its second attachment point to the first inertial mass 1511. Correspondingly, a second suspender 1532 is attached from its first attachment point to a second anchor point 1522 and from its second attachment point to the second inertial mass 1512. Both inertial masses have a first longitudinal end 1591 and a second longitudinal end 1592.

The two inertial masses 1511 and 1512 may be mechanically coupled to each other and synchronized, for example, with a single torsion spring 1571 for out-of-plane bending (as illustrated in FIGS. 15*a* and 15*b*), and with a single bending spring 1572 for in-plane bending (FIGS. 15*c* and 15*d*). Other coupling mechanisms may also be used.

In FIG. 15*a*, the first suspender 1531 and the second suspender 1532 extend toward the first longitudinal ends of their respective inertial masses 1511 and 1512 from their respective anchor points 1521 and 1522. The transducers on the first suspender 1531 and the transducer on the second suspender 1532 have the opposite polarity, as illustrated by their colouring. When both transducers are driven with the same drive voltage signal, this transducer setup will induce anti-phase oscillation in the two inertial masses 1511 and 1512, so that one mass rotates clockwise about the x-axis when the other rotates counter-clockwise, and vice versa. A differential sense voltage signal can be read from the transducers in the sense mode.

Anti-phase oscillation can alternatively be produced with the transducer setup illustrated in FIG. 15b, where the anchor points 1521 and 1522 have different y-coordinates. The first suspender 1531 extends towards the first longitudinal end 1591 of the first inertial mass 1511, while the second suspender 1532 extends towards the second longitudinal end 1592 of the second inertial mass 1512. In other words, first and second suspenders 1531 and 1532 extend in opposite longitudinal directions from their respective anchor points 1521 and 1522. This time the transducers on the first suspender 1531 and the transducer on the second suspender 1532 have the same polarity, as illustrated by their colouring. When both transducers are driven with the same drive voltage signal, this transducer setup will induce anti-phase oscillation in the two inertial masses 1511 and 1512.

The same alterations can be applied to transducer setups which drive and detect in-plane oscillation, as illustrated in FIGS. 15c and 15d. Anti-phase oscillation can be produced either by arranging the split transducers in the opposite order on two suspenders which extend in the same longitudinal direction, as illustrated in FIG. 15c, or by arranging the split transducers in the same order on two suspenders which extend in opposite longitudinal directions, as illustrated in FIG. 15d.

Second Resonator System Embodiment

The first and second inertial masses may also be mechanically coupled and synchronized with a spring system which comprises a third anchor point between the first and second inertial masses, a first longitudinal spring extending from the third anchor point to a first transversal bar, a second longitudinal spring extending from the first transversal bar to the first inertial mass, and a third longitudinal spring extending from the first transversal bar to the second inertial mass. The spring system may also comprise a fourth anchor point between the first and second inertial masses, a fifth longitudinal spring extending from the fourth anchor point to a second transversal bar, a sixth longitudinal spring extending from the second transversal bar to the first inertial mass, and a seventh longitudinal spring extending from the second transversal bar to the second inertial mass.

FIG. 16 illustrates a resonator system with this mechanical coupling arrangements. The spring system may comprise structures at only one longitudinal end of the resonator system, or at both ends. The latter alternative is illustrated in FIG. 16. The resonator system is illustrated with out-of-plane transducers in FIG. 16, but the same mechanical coupling can also be implemented for a resonator system with in-plane transducers. The first and second longitudinal ends of the inertial masses have not been indicated with reference numbers in order to preserve clarity.

FIG. 16 illustrates a resonator system where the number of anchor points is two and the number of suspenders is also two. Any of the resonators described above could be implemented in a resonator system, and the number of anchor points and number of suspenders could thereby be multiplied without increasing the number of resonators. In FIG. 16 a first inertial mass 1611 is suspended from a first anchor point 1621 by first suspender 1631. A second inertial mass 1612 is suspended from a second anchor point 1622 from second suspender 1632. Both suspenders 1631 and 1632 extend from their respective anchor points toward the first longitudinal ends of the inertial masses to which they are attached.

In this case the spring system comprises additional central anchor points, third anchor point 1623 and fourth anchor point 1624. One end of the first and fourth longitudinal springs 1671 and 1674 is attached to each of these anchor points, as illustrated in FIG. 16. The other end of the first and fourth longitudinal springs 1671 and 1674 may be attached to first and second transversal bars 1681 and 1682, respectively. A second longitudinal spring 1672 may be attached from its end to the first transversal bar 1681 and from its other end to the first inertial mass 1611. A third longitudinal spring 1673 may be attached from one end to the first transversal bar 1681 and from its other end to the second inertial mass 1612. A fifth longitudinal spring 1675 may be attached from one end to the second transversal bar 1682 and from its other end to the first inertial mass 1611. A sixth longitudinal spring 1676 may be attached from one end to the second transversal bar 1682 and from its other end to the second inertial mass 1612.

The second, third, fifth and sixth longitudinal springs 1672-1673 and 1675-1676 may be attached to the sides of the inertial masses 1611-1612 which lie opposite to the third and fourth anchor points 1623 and 1624. This is illustrated in FIG. 16. Alternatively, the second, third, fifth and sixth longitudinal springs 1672-1673 and 1675-1676 may be attached to the inertial masses 1611-1612 at either of their longitudinal ends, for example close to the longitudinal middle line of each inertial mass.

The springs 1671-1676 and the transversal bars 1681-1682 are narrow in one direction, as illustrated in FIG. 16. The higher their aspect ratio, the more efficient the suppression of the common mode. High aspect ratios are also preferable because synchronization will affect the total spring constant of the desired oscillation modes less when the aspect ratio is high. The aspect ratio of the springs and the transversal bar may preferably be in the range 8-12, but even an aspect ratio of 3.4 suppresses common mode oscillation significantly without changing the spring constant by more than 10%.

The longitudinal springs 1671-1676 may have flexibility for in-plane bending and twisting about the y-axis, but are stiff for out-of-plane bending. The transversal bars 1681-1682 may be stiff for all bending and twisting modes, but it may also be given some flexibility for in-plane bending. Flexibility for in-plane bending may be needed especially if the points of attachment of springs 1672-1673 and 1675-1676 do not lie on the longitudinal middle line of each inertial mass. Flexibility in the transversal bar may also improve the linearity of the in-plane spring action.

The resonator systems described and illustrated above all comprise suspenders which are straight beams of uniform width that extend all the way from the anchor point to the inertial mass. It is also possible to prepare a flexure at the end of the suspender, which connects the suspender to the inertial mass at the second attachment point (for example points 1551 and 1552 in FIG. 15a). The flexures can have in-plane and torsional flexibility. Straight or folded beams, and combinations of straight and folded beams, can be used as flexures.

First Gyroscope Embodiment

Any of the resonator systems described above may be implemented in a gyroscope when they are configured to enable two orthogonal resonance modes and when they comprises at least two transducers, one for actuating the drive motion and one for sensing the secondary rotational oscillation motion which results from the Coriolis force when the gyroscope undergoes angular motion. In general terms, the benefit of using resonators according to the preceding embodiments in a gyroscope is that a high coupling factor is obtained in the drive transducers and a large signal is obtained in the sense transducers.

Several transducer configurations are possible in a gyroscope. FIGS. 17-20 illustrate three alternative configurations in gyroscopes according to a first gyroscope embodiment.

Figure 17:
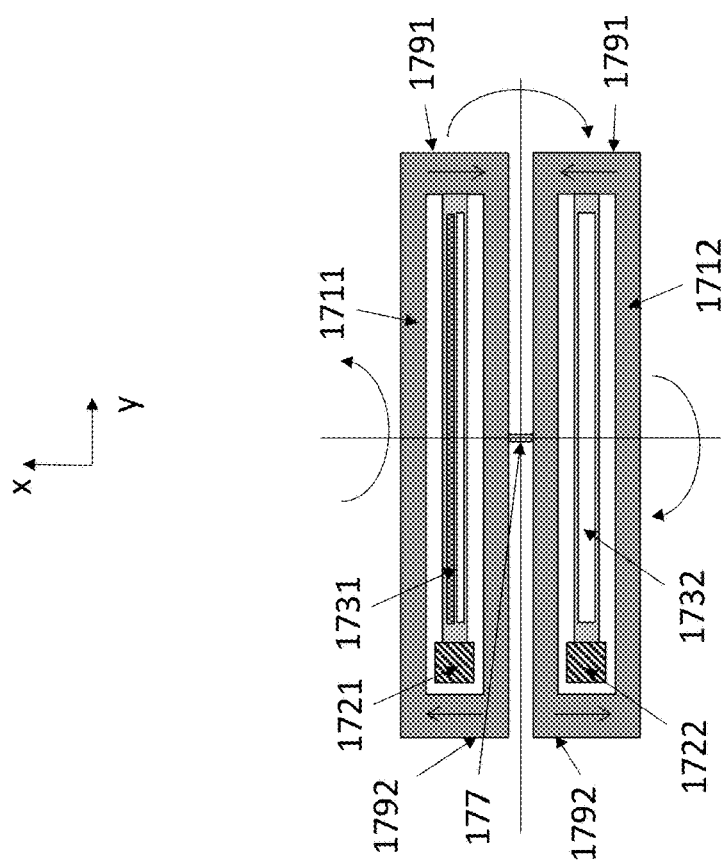
FIG. 17 illustrates a first gyroscope embodiment.

At least one of the one or more first suspenders attached to the first inertial mass may be coated with an in-plane transducer, and at least one of the one or more second suspenders attached to the second inertial mass may be coated with an out-of-plane transducer. FIG. 17 illustrates a gyroscope with a resonator system where a first inertial mass 1711 can be driven to rotational in-plane oscillation by the drive transducers on the first suspender 1731. The bending spring 177 couples this in-plane oscillation to the second inertial mass 1712. Other coupling mechanisms may also be used, such as the one described in the second resonator system embodiment above. Both inertial masses 1711 and 1712 may obtain the same in-plane rotation amplitude, as illustrated by white arrows on the inertial masses. If the gyroscope then undergoes rotation about the y-axis, the Coriolis force will induce a secondary rotational oscillation about the x-axis. This oscillation may be detected and measured by sense transducers on the second suspender 1732. In this case the first suspender 1731 attached to first inertial mass 1711 is coated with an in-plane transducer, while the second suspender 1732 attached to second inertial mass 1712 is coated with an out-of-plane transducer.

The transducer on the second suspender 1732 may also be used as drive transducers, and the transducer on the first suspender 1731 may be used as sense transducers. However, it may be preferable to use out-of-plane transducers as sense transducers because they usually have better electro-mechanical coupling than in-plane transducers. The sense signal tends to be stronger in an out-of-plane transducer than in an in-plane transducer, and maximizing the sense signal is usually a more important consideration than maximizing the driving force.

The in-plane and out-of-plane resonance frequencies may preferably be close to each other. The rotational inertia in relation to the rotation axes may be the same in in-plane oscillation and out-of-plane oscillation. The easiest way to make the in-plane and out-of-plane resonance frequencies equal or very close to equal may be to prepare both suspenders 1731 and 1732 with the same even breadth and height profiles, with the height equal or very close to equal to breadth. In other words, the transversal breadth of each suspender (in the x-direction) may be equal or close to equal to the vertical thickness of that suspender (in the z-direction), and the transversal breadths and vertical thicknesses of both suspenders 1731 and 1732 may be equal or close to equal along their entire longitudinal length.

Figure 18:
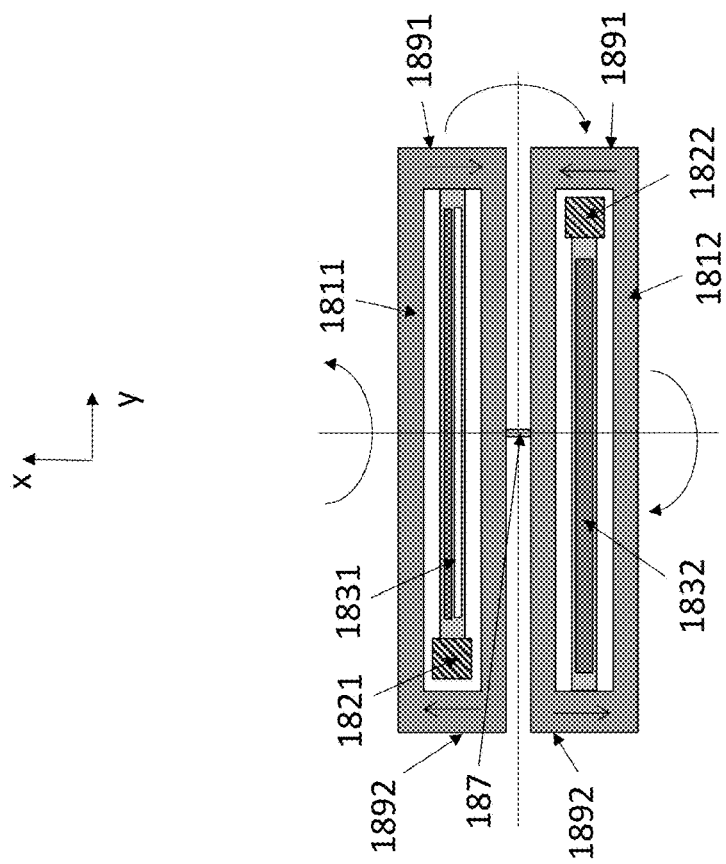
FIG. 18 illustrates a first gyroscope embodiment with an alternative configuration.

The first suspender 1731 and the second suspender 1732 both extend toward the first longitudinal ends 1791 of the inertial masses 1711 and 1712 from their respective anchor points 1721 and 1722 in FIG. 17. FIG. 18 illustrates an alternative arrangement where first suspender 1831 extends toward the first longitudinal end 1891 of inertial mass 1811, and second suspender 1832 extend toward the second longitudinal end 1892 of inertial mass 1812 from their respective anchor points 1821 and 1822.

Figure 19:
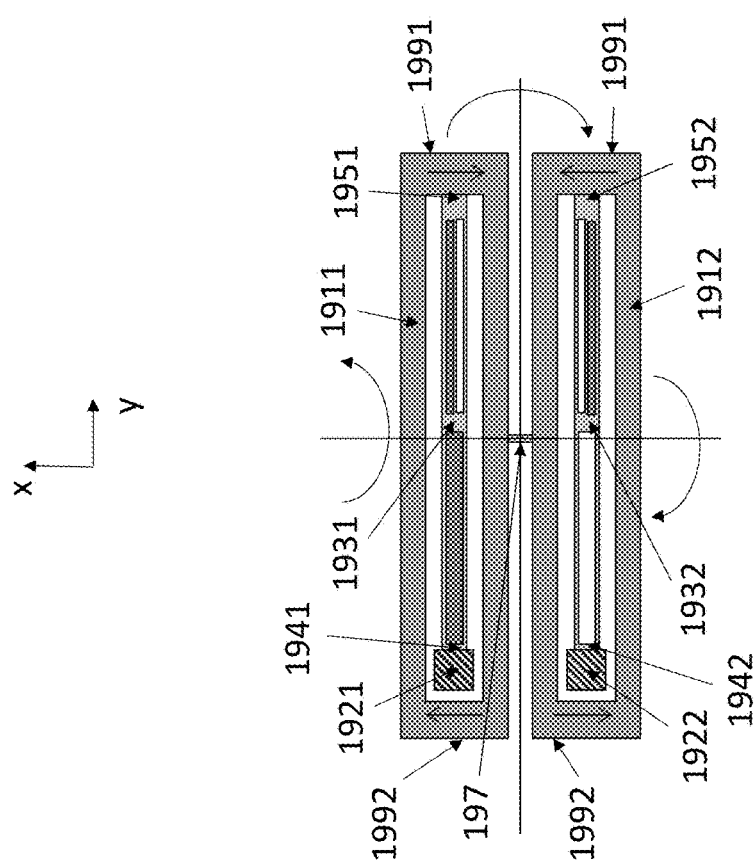
FIG. 19 also illustrates a first gyroscope embodiment with an alternative configuration.

FIG. 19 illustrates a gyroscope where both resonators comprise both in-plane and out-of-plane transducers on suspenders 1931 and 1932, respectively. The spring 197 may be a bending spring or a torsional spring depending on which transducers are used as drive transducers. Other coupling mechanisms may also be used, such as the one described in the second resonator system embodiment above. In the illustrated configuration the out-of-plane transducers on the two suspenders have opposite polarities and the split transducers which form the in-plane transducer are arranged in the opposite order on the two suspenders. It may be preferable to place the in-plane transducers closer to second attachment points 1951 and 1952 and out-of-plane transducers closer to first attachment points 1941 and 1942, as illustrated in FIG. 19, and to use the in-plane transducers as drive transducers and out-of-plane transducers as sense transducers. However, the opposite configuration is possible on both counts, as illustrated in FIG. 20.

Figure 20:
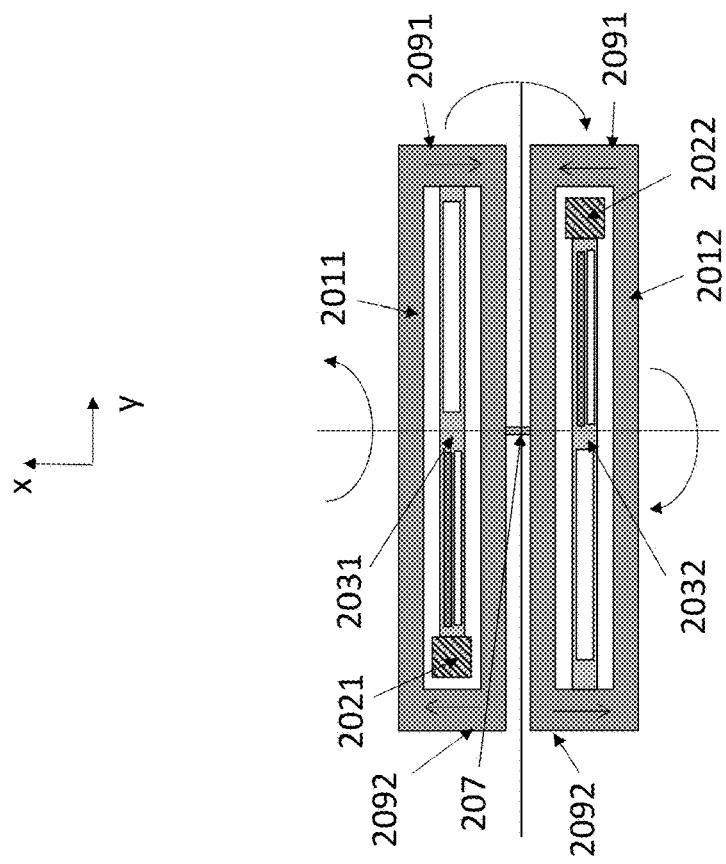
FIG. 20 also illustrates a first gyroscope embodiment with an alternative configuration.

FIG. 20 also illustrates a configuration where the first suspender 2031 extends toward first longitudinal end 2091 and second suspender 2032 extends toward second longitudinal end 2092 from their respective anchor points 2021 and 2022. In this configuration anti-phase oscillation can be produced by coating out-of-plane transducers of the same polarity on first and second suspenders 2031 and 2032, and by arranging the split transducers which form the in-plane transducer in the same order on the two suspenders.

A person skilled in the art will understand that a complete gyroscope may also include additional functions, such as detection of the primary amplitude and a force feedback for the sense mode. These functions can be accomplished with additional transducers, which can be placed either on the suspenders illustrated in FIGS. 17-20 or on auxiliary suspender structures. However, such additional functions, suspenders and transducers will not be described in further detail in this disclosure.

All variants of this first gyroscope embodiment may be implemented together with any of the preceding resonator embodiments and resonator system embodiments.

Second Gyroscope Embodiment

Figure 22:
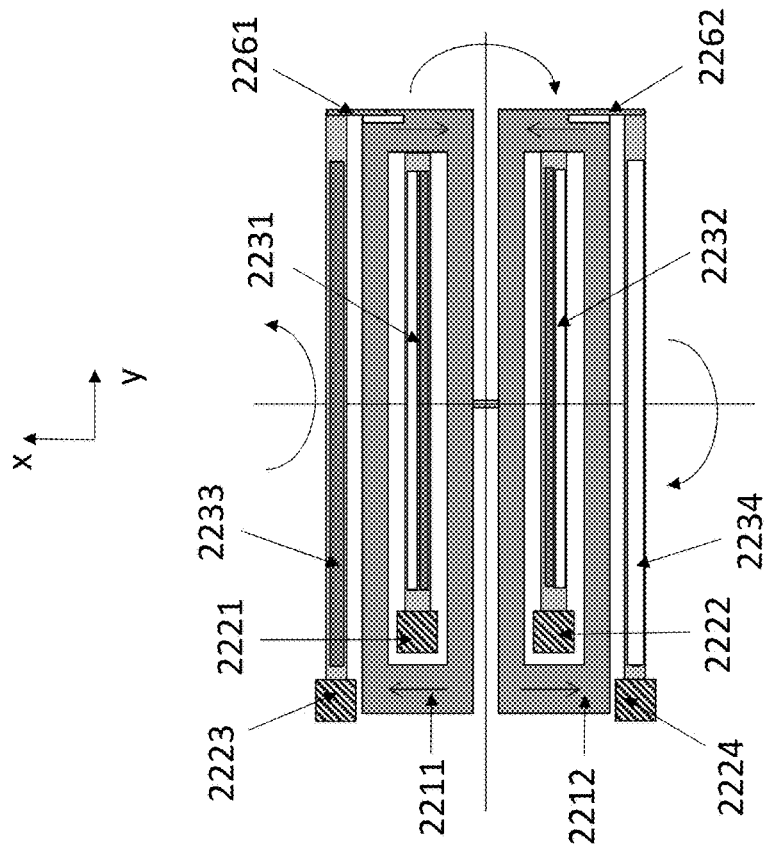
FIG. 22 illustrates a second gyroscope embodiment with an alternative configuration.
Figure 21:
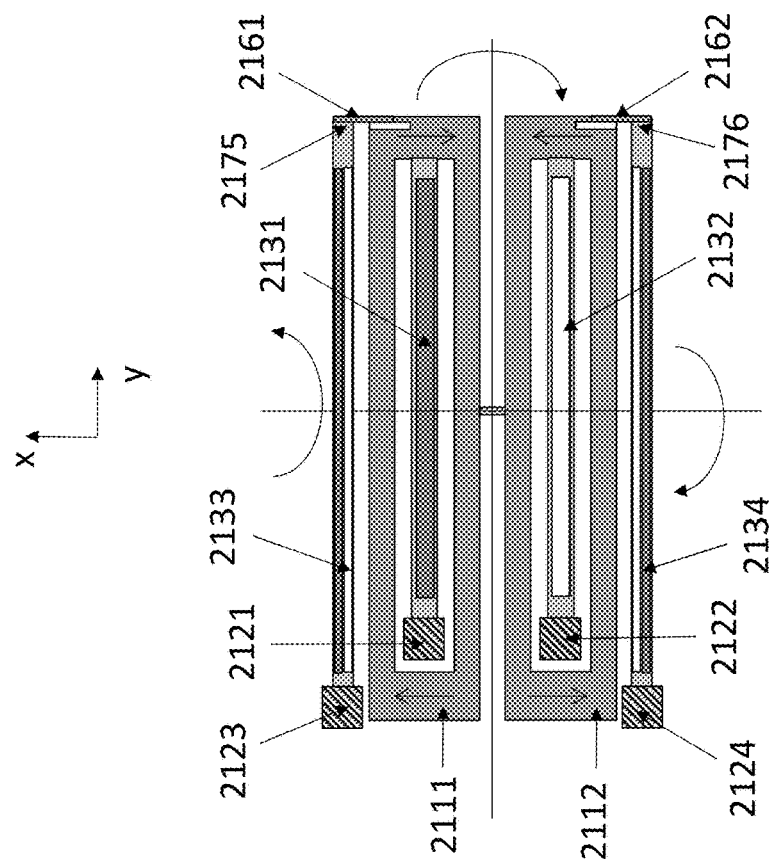
FIG. 21 illustrates a second gyroscope embodiment.
Figure 23:
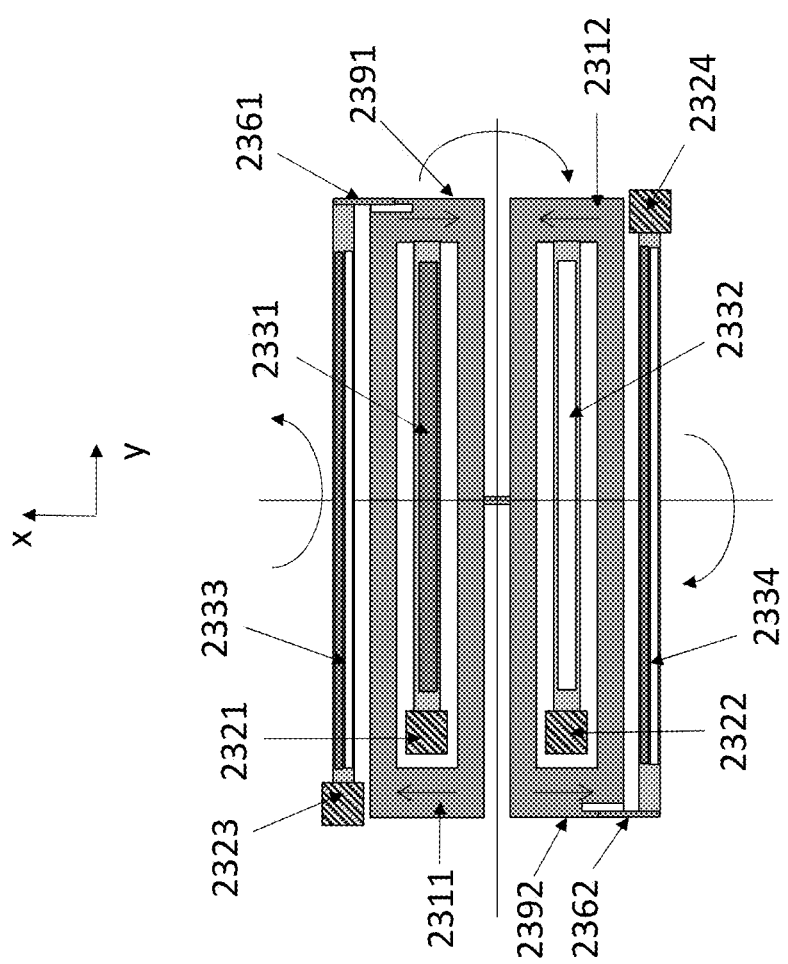
FIG. 23 also illustrates a second gyroscope embodiment with an alternative configuration.

FIGS. 21-23 illustrate resonator systems according to a second gyroscope embodiment, which may be implemented in conjunction with the first gyroscope embodiment. In this embodiment the resonator system additionally comprises at least one external suspender coated with a piezoelectric transducer structure configured to drive or detect the oscillating rotary movement of an inertial mass, wherein one end of the external suspender is attached to an anchor point and the other end of the external suspender is attached with a flexure to one of the inertial masses.

FIG. 21 illustrates a resonator system with first and second suspenders 2131 and 2132 attached to first and second anchor points 2121 and 2122 and inertial masses 2111 and 2112, respectively. The suspenders 2131-2132 may be called "internal" suspenders because they are located in the central openings of inertial masses 2111 and 2112.

In the illustrated resonator system, third and fourth suspenders 2133 and 2134 have been placed adjacent to the inertial masses 2111 and 2112. These third and fourth suspenders may called "external suspenders" because they are not located in the central openings of the inertial masses 2111 and 2112. In the illustrated system the internal suspenders 2131 and 2132 are coated with out-of-plane transducers, and the external suspenders 2133 and 2134 are coated with in-plane transducers. This arrangement may be reversed, so that suspenders 2131 and 2132 are coated with in-plane transducers and suspenders 2133 and 2134 with out-of-plane transducers. This alternative configuration is illustrated in FIG. 22, where the numbered components correspond to the components numbered in FIG. 21. In either configuration, the additional suspenders facilitate the use of more transducer area both for driving the resonator system and for sensing the oscillation which arises from the Coriolis effect.

In addition to the first and second anchor points 2121 and 2122 within the central openings of the inertial masses 2111 and 2112, the gyroscope illustrated in FIG. 21 comprises third and fourth anchor points 2123 and 2124. External suspenders 2133 and 2134 are attached from their first end to second anchor points 2123 and 2124, respectively. The second end of suspenders 2133 and 2134 may be attached to inertial masses 2111 and 2112, respectively, via first and second flexures 2161 and 2162. The flexures 2161 and 2162 should provide flexibility for in-plane and out-of-plane rotation since the in-plane and out-of-plane angles of the end 2175 or 2176 of the suspender 2133 or 2134 and the corresponding angles of the corresponding inertial mass 2111 or 2112 will be different and no torque should be generated by the flexure at the attachment point. Also, flexibility should be provided for translation along the y-axis to prevent tension of the suspenders 2133 and 2134 due to bending and thus nonlinearity of the suspenders. But the flexures 2161 and 2162 should be stiff for translation along the x- or z-axes in order to be able to transmit force in x- or z-directions. One of these forms of stiffness is needed depending on which transducers are used for drive and which for sensing. The transducers on the internal suspenders 2131 and 2132 may be used as drive transducers and the transducers on the external suspenders 2133 and 2134 may be used as sense transducers, or vice versa.

As in the preceding resonator and resonator system embodiments, suspenders may extend in opposite longitudinal directions from their respective anchor points when the anchor points are suitably positioned. FIG. 23 illustrates a resonator system where the numbered components correspond to the components numbered in FIG. 21, but the external third suspenders 2333 extends toward the first longitudinal end 2391 of inertial mass 2311, while the external fourth suspender 2334 extends toward the second longitudinal end 2392 from their respective anchor points 2323 and 2324. External suspenders which extend in opposite longitudinal directions may be combined with internal suspenders which extend in the same longitudinal direction from their respective anchor points, as in FIG. 23, or with internal suspenders which extend in opposite longitudinal directions from their respective anchor points.

The external suspenders may be longer than the internal suspenders, as illustrated in FIGS. 21-23. They may also be shorter than the internal suspenders. The flexures may be attached to the inertial masses anywhere along the longitudinal ends of the inertial masses.

All variants of this second gyroscope embodiment may be implemented together with any of the preceding resonator embodiments and resonator system embodiments.

Clock Oscillator

Any resonator and flexure configuration described in the preceding resonator embodiments and resonator system embodiments can be implemented in a clock oscillator with additions known from the prior art. In general terms, the benefits of using resonators according to the preceding embodiments in a clock oscillator include at least a high coupling factor, small motional resistance, reliable startup and low noise.

The invention claimed is:

1. A rotational resonator comprising:
a substrate with one or more anchor points and an inertial mass with a first longitudinal end and a second longitudinal end,
wherein the inertial mass is suspended from the one or more anchor points by one or more suspenders extending from the one or more anchor points toward either the first longitudinal end or the second longitudinal end of the inertial mass,
wherein one or more of the suspenders are coated with a piezoelectric transducer structure configured to drive or detect oscillating rotary movement in the inertial mass, and
wherein no more than one suspender is attached to any of the anchor points, and that the longitudinal length of each coated suspender is 0.5-1 times the longitudinal length of the inertial mass.

2. A rotational resonator according to claim 1, wherein the distance from either the rotation axis of the inertial mass, or from the transversal line which crosses the rotation axis of the inertial mass, to the effective center of gravity of the resonator does not exceed 0.01 times the length of any of the one or more coated suspenders at any point in the oscillation cycle.

3. A rotational resonator according to claim 2, wherein each of the one or more coated suspenders have an even transversal breadth profile and even vertical height profile along the entire longitudinal length of the suspender and that the longitudinal distance on each coated suspender from the anchor point to which it is attached to the transversal line which passes through the effective center of gravity of the resonator is 0.49-0.51 times the length of the coated suspender.

4. A rotational resonator according to claim 1, wherein the number of suspenders is one.

5. A rotational resonator according to claim 4, wherein the inertial mass comprises one internal opening and that one anchor point and one suspender is located in this internal opening.

6. A rotational resonator according to claim 4, wherein the inertial mass comprises one external opening and that one anchor point and one suspender is located in this external opening.

7. A rotational resonator according to claim 1, wherein the number of anchor points is at least two and the number of suspenders is at least two.

8. A rotational resonator according to claim 7, wherein the inertial mass comprises at least two external openings and that one anchor point and one suspender is located in at least two of the external openings.

9. A rotational resonator according to claim 7, wherein the inertial mass comprises at least two internal openings and that one anchor point and one suspender is located in at least two of the internal openings.

10. A rotational resonator according to claim 7, wherein the inertial mass comprises at least one internal opening and that at least two anchor points and at least two suspenders are located in the same internal opening.

11. A rotational resonator according to claim 7, wherein all of the at least two suspenders extend toward the same longitudinal end of the inertial mass from their respective anchor points.

12. A rotational resonator according to claim 7, wherein at least one of the at least two suspenders extends from its anchor point toward a first longitudinal end of the inertial mass, while another of the at least two suspenders extends from its anchor point toward a second longitudinal end of the inertial mass.

13. A rotational resonator according to claim 1, wherein at least one of the coated suspenders is coated with a piezoelectric transducer structure configured to drive or detect in-plane rotational oscillation.

14. A rotational resonator according to claim 1, wherein at least one of the coated suspenders is coated with a piezoelectric transducer structure configured to drive or detect out-of-plane rotational oscillation.

15. A rotational resonator according to claim 1, wherein at least one of the coated suspenders is coated with a piezoelectric transducer structure configured to drive or detect in-plane rotational oscillation and also with a piezoelectric transducer structure configured to drive or detect out-of-plane rotational oscillation.

* * * * *